United States Patent
Hosoda et al.

(10) Patent No.: US 12,387,789 B2
(45) Date of Patent: Aug. 12, 2025

(54) X-DIRECTION DIVIDED SUB-BLOCK MODE IN NAND

(71) Applicant: SanDisk Technologies LLC, Addison, TX (US)

(72) Inventors: Naohiro Hosoda, Yokkaichi (JP); Hiroyuki Ogawa, Nagoya (JP)

(73) Assignee: Sandisk Technologies, Inc., Milpitas, CA (US)

( * ) Notice: Subject to any disclaimer, the term of this patent is extended or adjusted under 35 U.S.C. 154(b) by 203 days.

(21) Appl. No.: 18/358,654

(22) Filed: Jul. 25, 2023

(65) Prior Publication Data

US 2024/0212755 A1    Jun. 27, 2024

Related U.S. Application Data

(60) Provisional application No. 63/477,355, filed on Dec. 27, 2022.

(51) Int. Cl.
| | |
|---|---|
| *G11C 16/04* | (2006.01) |
| *G11C 16/10* | (2006.01) |
| *G11C 16/16* | (2006.01) |
| *H10B 41/27* | (2023.01) |
| *H10B 41/35* | (2023.01) |
| *H10B 43/27* | (2023.01) |
| *H10B 43/35* | (2023.01) |

(52) U.S. Cl.
CPC .......... *G11C 16/0483* (2013.01); *G11C 16/10* (2013.01); *G11C 16/16* (2013.01); *H10B 41/27* (2023.02); *H10B 41/35* (2023.02); *H10B 43/27* (2023.02); *H10B 43/35* (2023.02)

(58) Field of Classification Search
CPC ..... G11C 16/0483; G11C 16/10; G11C 16/16; G11C 16/08; H10B 41/27; H10B 41/35; H10B 43/27; H10B 43/35
See application file for complete search history.

(56) References Cited

U.S. PATENT DOCUMENTS

| | | |
|---|---|---|
| 7,170,783 B2 | 1/2007 | Ha et al. |
| 8,988,939 B2 | 3/2015 | Dunga et al. |
| 9,171,627 B2 | 10/2015 | Lee et al. |
| 9,330,761 B2 | 5/2016 | Maejima |
| 9,330,765 B2 | 5/2016 | Kim |
| 9,653,171 B2 | 5/2017 | Abraham et al. |

(Continued)

*Primary Examiner* — Amir Zarabian
*Assistant Examiner* — Bradley S Coon
(74) *Attorney, Agent, or Firm* — Pearl Cohen Zedek Latzer Baratz LLP

(57) ABSTRACT

A memory system having an x-direction (bit line direction) divided sub-block mode. Each block is divided in a y-direction and in the x-direction into a number of groups of contiguous NAND strings that are referred to as XY sub-blocks. The memory system performs a memory operation in parallel in multiple XY sub-blocks in a block while inhibiting the memory operation in the other XY sub-blocks in the block. Each XY sub-block for which the memory operation is performed has its NAND strings connected to a different set of contiguous bit lines. In an aspect the memory operation is a program operation with selected memory cells in each of the multiple XY sub-blocks programmed in parallel while inhibiting programming of all memory cells in all other XY sub-blocks in the block. In one aspect, the memory operation is an erase operation.

17 Claims, 19 Drawing Sheets

(56) References Cited

U.S. PATENT DOCUMENTS

| | | |
|---|---|---|
| 10,541,029 B2 | 1/2020 | Feeley et al. |
| 11,361,816 B2 | 6/2022 | Cui et al. |
| 2004/0095836 A1 | 5/2004 | Choi et al. |
| 2014/0036590 A1* | 2/2014 | Feeley ............... G11C 16/08 365/185.11 |
| 2018/0240527 A1 | 8/2018 | Zhang et al. |
| 2018/0374551 A1* | 12/2018 | Hu ................ G11C 16/3459 |
| 2019/0109190 A1* | 4/2019 | Carlson ................ H10B 43/30 |
| 2019/0348129 A1 | 11/2019 | Chin et al. |
| 2020/0258558 A1 | 8/2020 | Prakash et al. |
| 2021/0280251 A1 | 9/2021 | Lee |
| 2022/0059157 A1* | 2/2022 | Cui ................ G11C 11/4085 |
| 2022/0157841 A1 | 5/2022 | Tsutsumi et al. |
| 2022/0157842 A1 | 5/2022 | Tsutsumi et al. |
| 2022/0199184 A1* | 6/2022 | Muchherla ............ G11C 29/52 |
| 2022/0310160 A1* | 9/2022 | Khakifirooz ......... G06F 3/0659 |
| 2022/0336484 A1 | 10/2022 | Iwai et al. |
| 2023/0207019 A1* | 6/2023 | Miranda ............... G11C 16/10 365/189.011 |

\* cited by examiner

1000

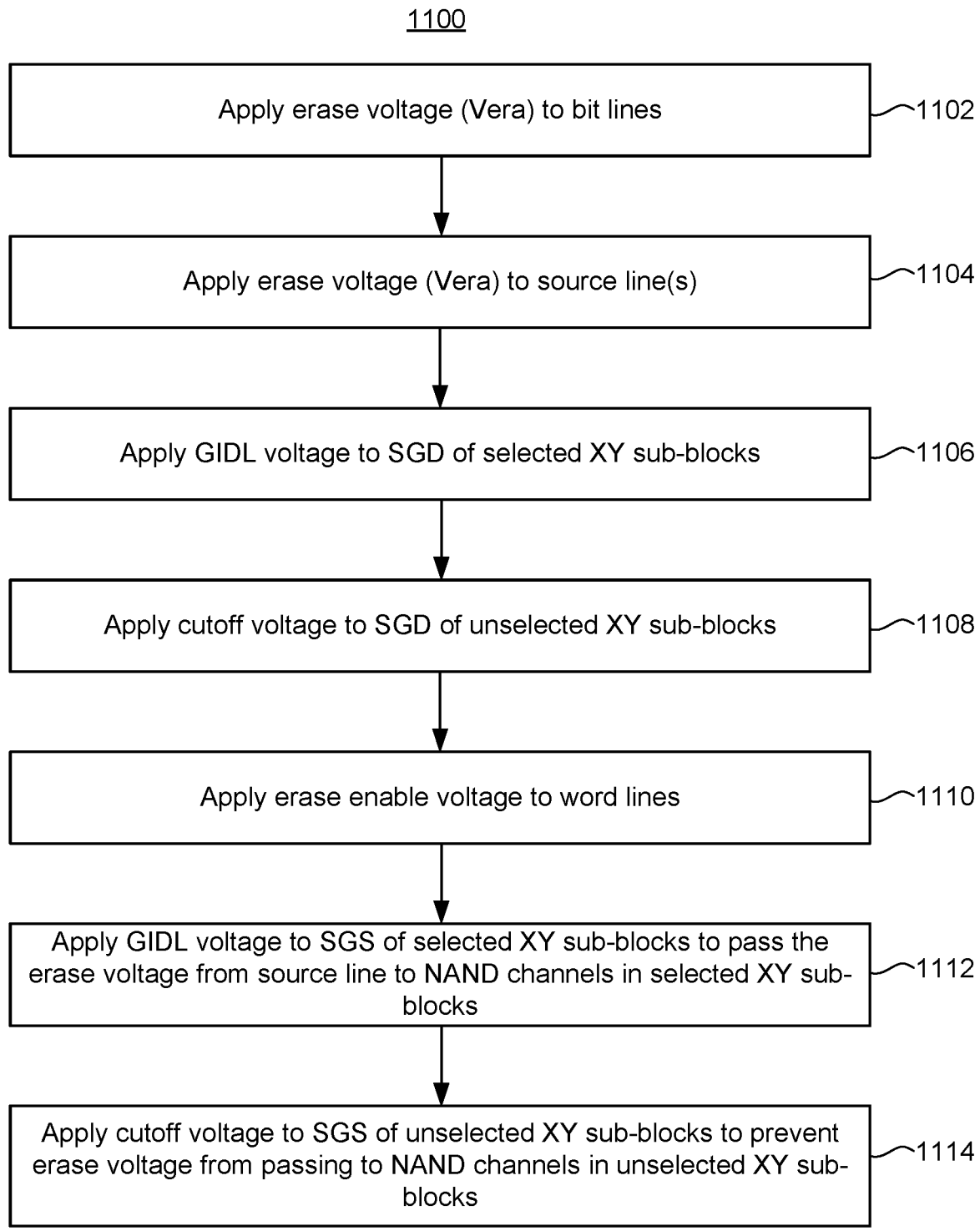

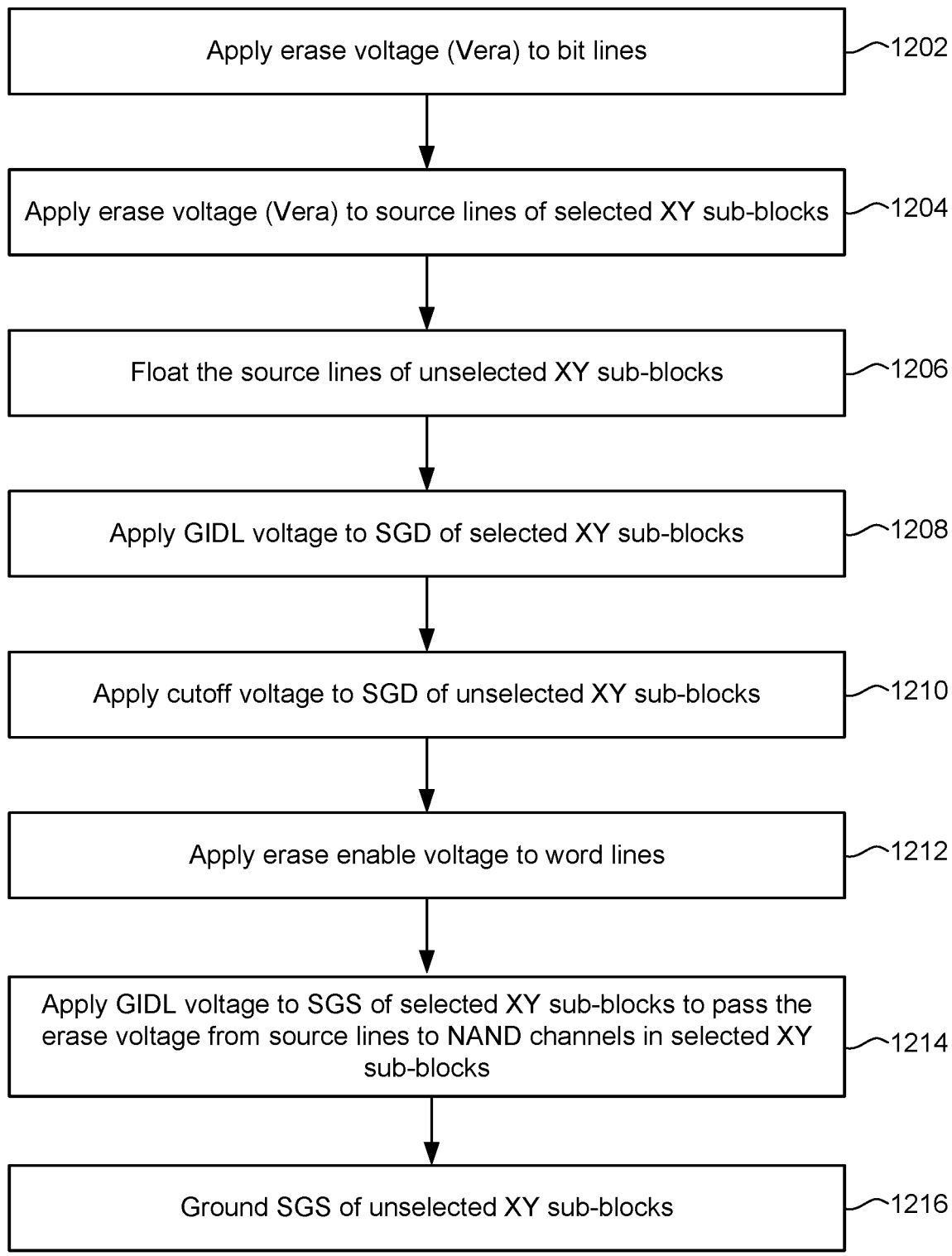

X-DIRECTION DIVIDED SUB-BLOCK MODE IN NAND

CLAIM OF PRIORITY

The present application claims priority from U.S. Provisional Patent Application No. 63/477,355, entitled "X-DIRECTION DIVIDED SUB-BLOCK MODE IN NAND," by Hosoda et al., filed Dec. 27, 2022, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

BRIEF DESCRIPTION OF THE DRAWINGS

Like-numbered elements refer to common components in the different figures.

FIG. 11 depicts a flowchart of one embodiment of a process of performing an erase operation in multiple XY sub-blocks in a block in parallel.

FIG. 12 depicts a flowchart of one embodiment of a process of performing an erase operation in multiple XY sub-blocks in a block in parallel in which each XY sub-block has its own source line.

DETAILED DESCRIPTION

Technology is disclosed herein for a memory system having an x-direction divided sub-block mode. The x-direction is the direction in which the individual bit lines extend across the blocks. In an embodiment, the memory system has a three-dimensional memory structure having a number of blocks. Each block has word lines and select lines. Each block has NAND strings extending in a z-direction through the block. Each word line of the block connects to each of the NAND strings. Therefore, an operating voltage applied to a word line can potentially affect (e.g., program, erase) a memory cell on every NAND string in the block. The block is divided in a y-direction and in the x-direction into a number of groups of contiguous NAND strings that are referred to herein as XY sub-blocks. The memory system performs a memory operation in parallel in multiple XY sub-blocks in a block while inhibiting the memory operation in the other XY sub-blocks in the block. Each XY sub-block for which the memory operation is performed has its NAND strings connected to a different set of contiguous bit lines.

In one embodiment, the memory operation is a program operation. Selected memory cells in each of the multiple XY sub-blocks are programmed in parallel while inhibiting programming of all memory cells in all other XY sub-blocks in the block. In one embodiment, the memory operation is an erase operation. Memory cells in each of the multiple XY sub-blocks are erased in parallel while inhibiting erase of all memory cells in all other XY sub-blocks in the block.

Figure 1:
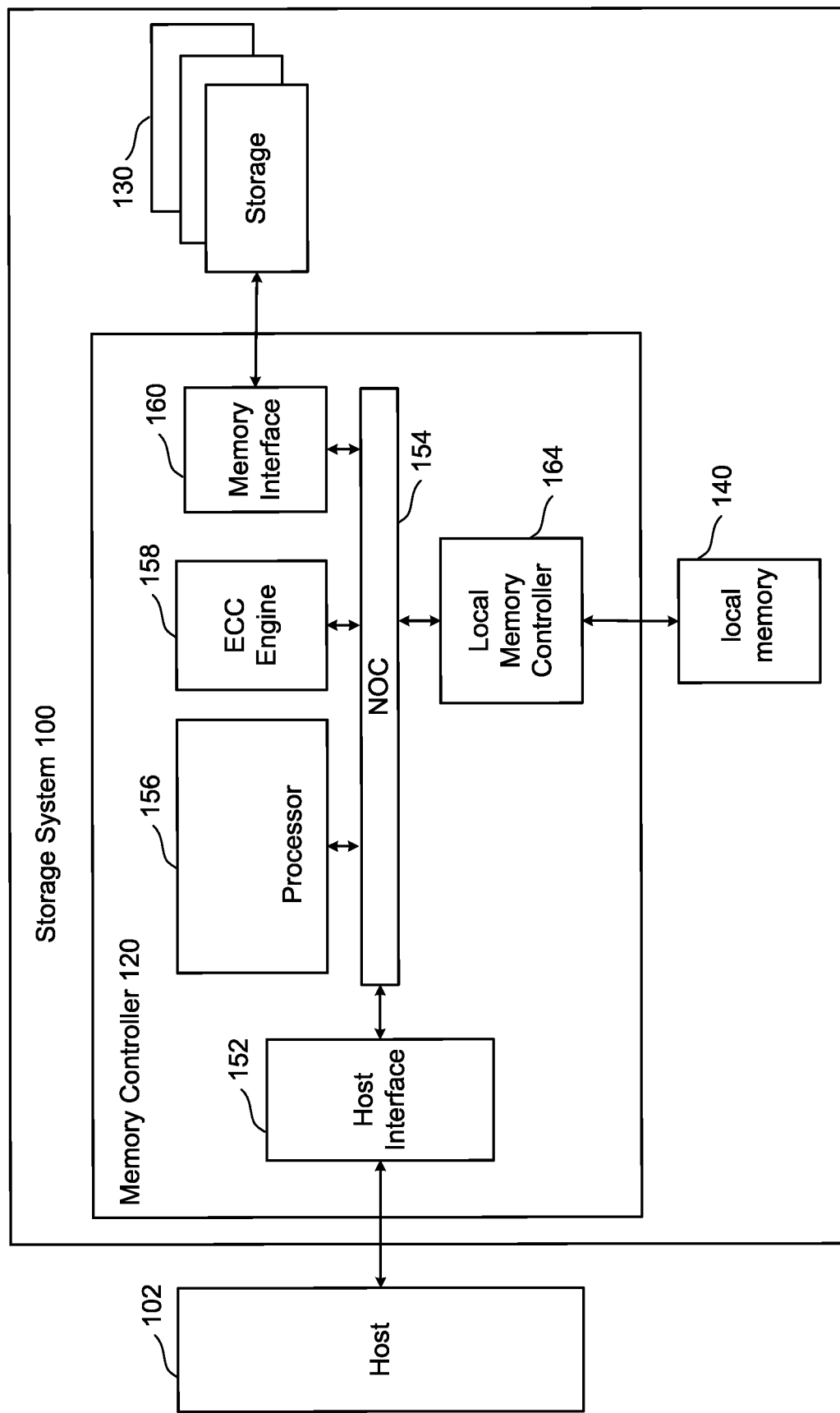
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
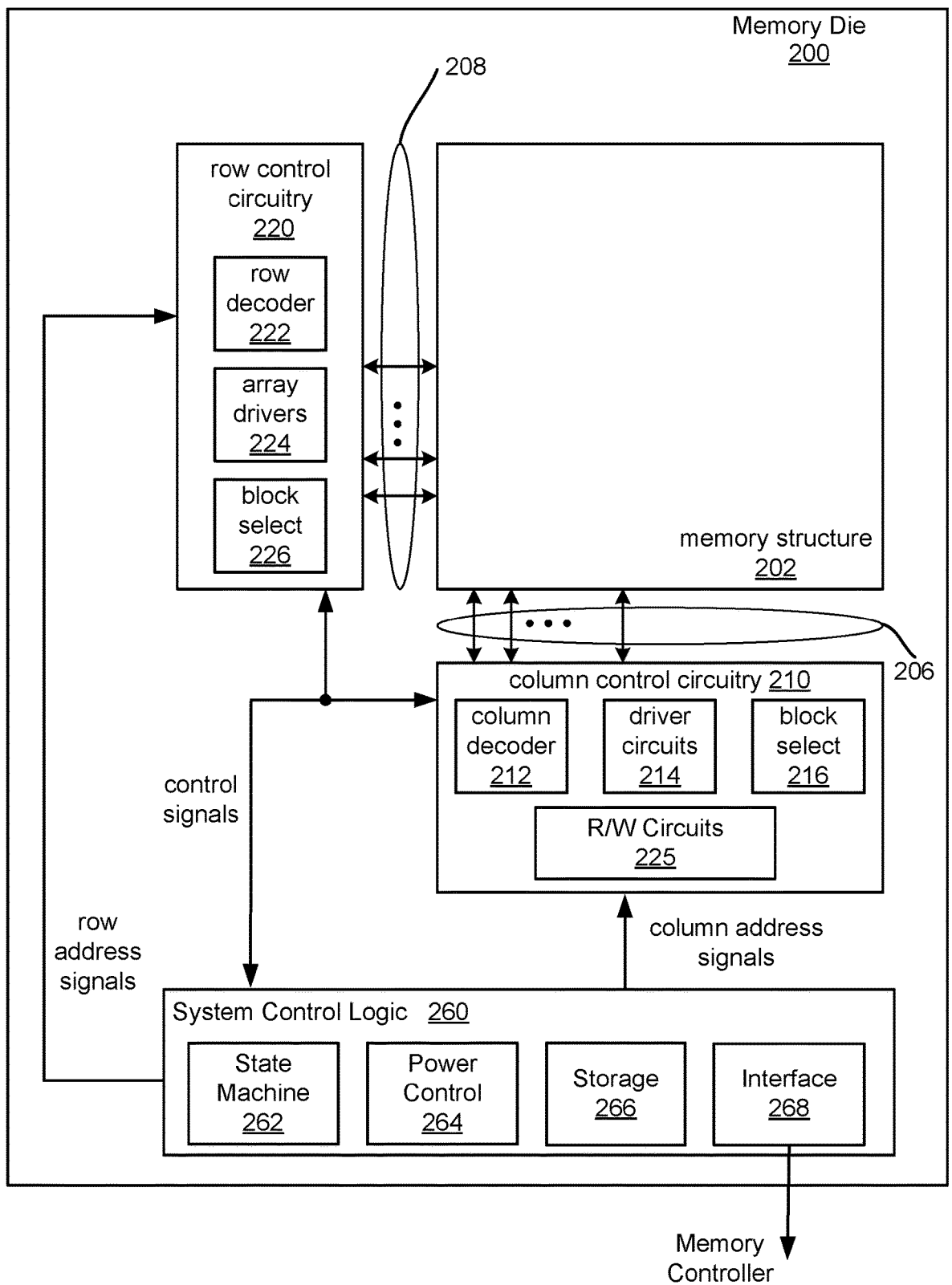
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
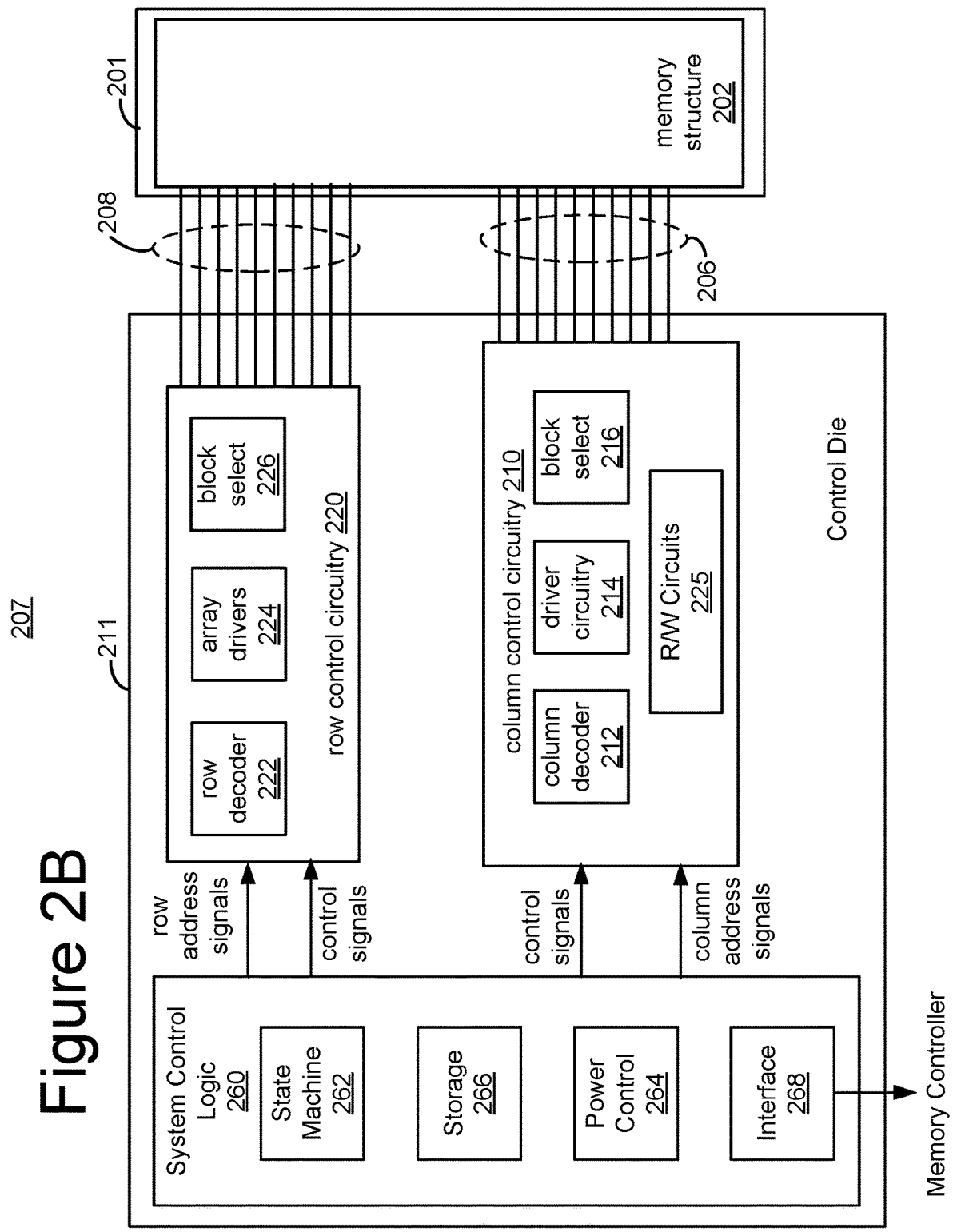
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
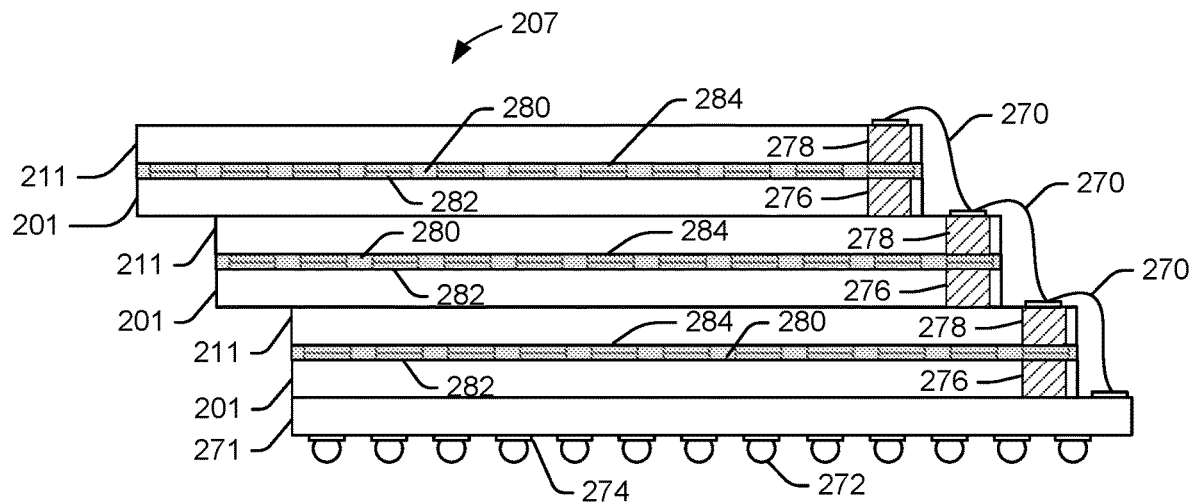
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
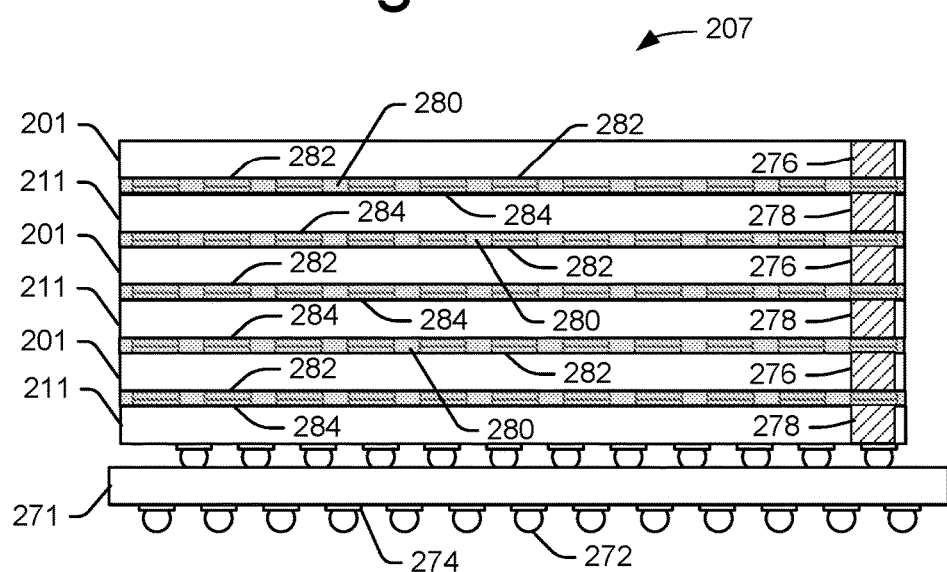

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4A:
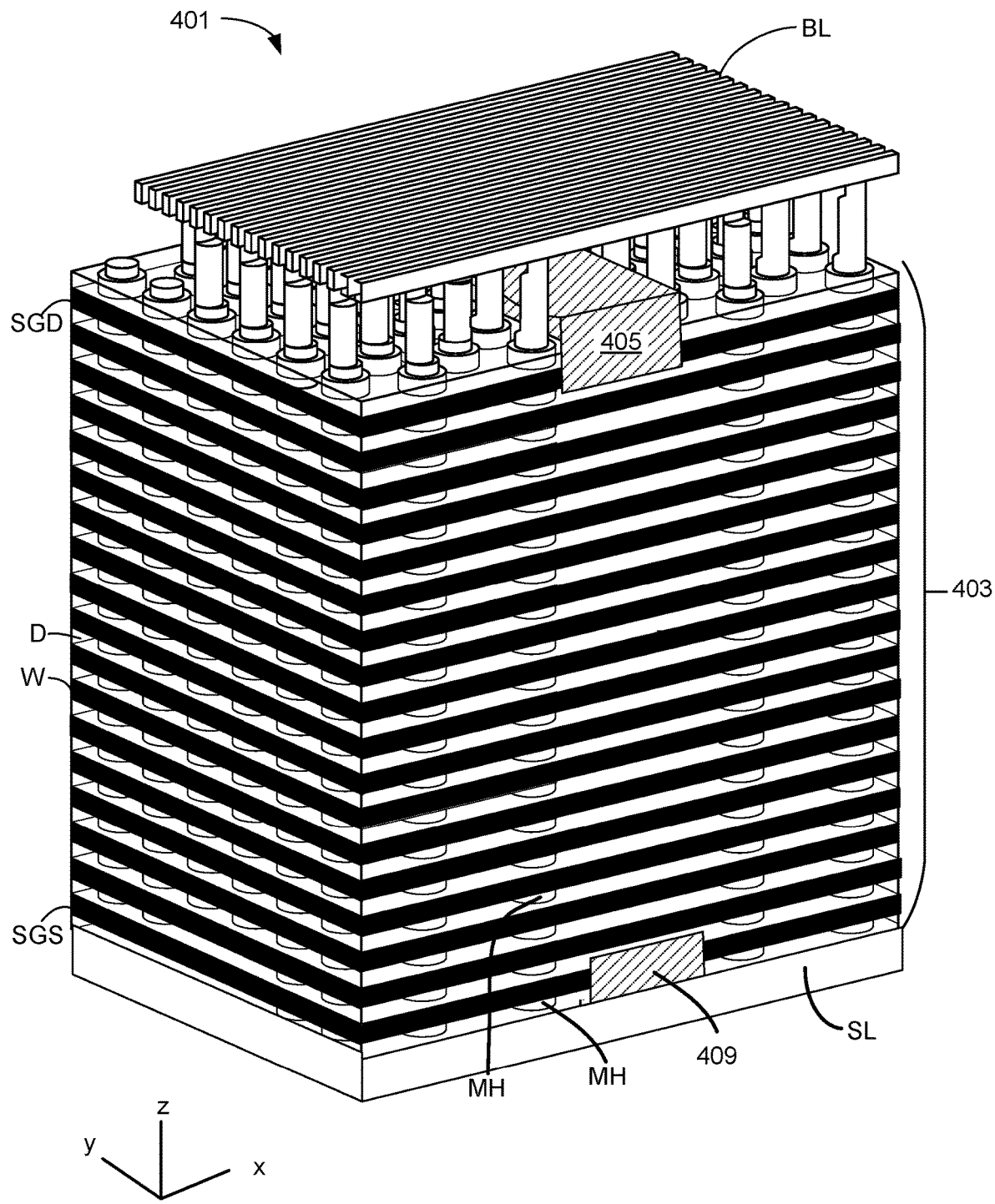
FIG. 4A is a perspective view of a portion of one example embodiment of a monolithic three dimensional memory structure.

FIG. 4A is a perspective view of a portion of one example embodiment of a monolithic three dimensional memory array/structure that can comprise memory structure 202, which includes a plurality non-volatile memory cells arranged as vertical NAND strings. For example, FIG. 4A shows a portion 401 of one block of memory. The structure depicted includes a set of bit lines BL positioned above a stack 403 of alternating dielectric layers and conductive layers. For example purposes, one of the dielectric layers is marked as D and one of the conductive layers (the conductive layers may include word line layers and select line layers) is marked as W. The number of alternating dielectric layers and conductive layers can vary based on specific implementation requirements. Below the alternating dielectric layers and conductive layers is a source line layer SL. Memory holes are formed in the stack of alternating dielectric layers and conductive layers. For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data.

In FIG. 4A, the topmost conductive layer is a drain side select gate layer (SGD) and the bottom-most conductive layer is a source side select gate layer (SGS). In some embodiments, more than one conductive layer operates as the SGD and/or more than one conductive layer operates as the SGS. FIG. 4A shows an insulating region 405 that extends in the y-direction in order to separate the SGD layer into two regions. There may be more of these insulating regions 405 to separate the SGD layer into more than two regions. FIG. 4A shows an insulating region 409 that extends in the y-direction in order to separate the SGS layer into two regions. There may be more of these insulating regions 409 to separate the SGS layer into more than two regions. Separating the SGD layer and SGS layer into multiple regions as depicted in FIG. 4A divides the block into what are referred to herein as "Y sub-blocks". The term "Y" is used to indicate that the block is cut in the y-direction. In some embodiments, the SGD and SGS are also cut in the x-direction. The x-direction cuts are not depicted in FIG. 4A. More details of the three dimensional monolithic memory array that comprises memory structure 202 is provided below.

Figure 4B:
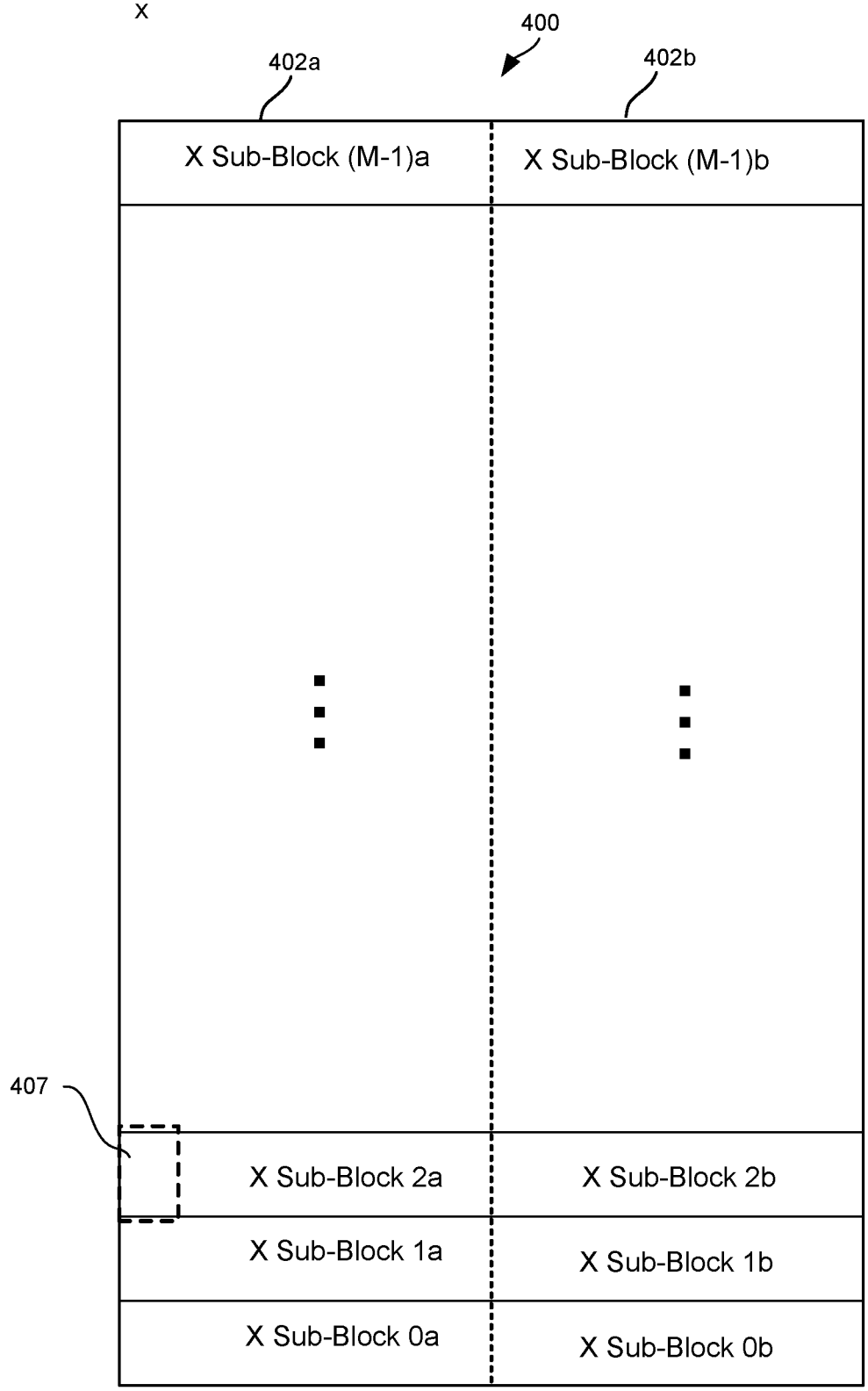
FIG. 4B is a block diagram explaining one example organization of one plane of the memory structure.

FIG. 4B is a block diagram explaining one example organization of one plane 400 of the memory structure 202. The memory structure 202 may have multiple planes 400. The plane is divided into M blocks. In one example, each plane has about 2000 blocks. However, different numbers of blocks and planes can also be used. Each block is divided into multiple X sub-blocks. In the example of FIG. 4B each block is divided into two X sub-blocks, but there could be more than two X sub-blocks in a block. The term "X sub-block" is used due the cut being made in the x-direction. Note that the x-direction is the direction in which the bit lines extend (see FIG. 4A). Herein the term "XY sub-block" is used to describe the intersection of one Y sub-block with one X sub-block. As an example, there may be six Y sub-blocks, two X sub-blocks, and twelve XY sub-blocks per block.

In one embodiment, an XY sub-block of memory cells is a unit of erase. That is, all memory cells of an XY sub-block are erased together. In an embodiment, multiple XY sub-blocks in a block are erased in parallel while inhibiting erase in all other XY sub-blocks in the block. In other embodiments, the entire block can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that block.

Figure 4C:
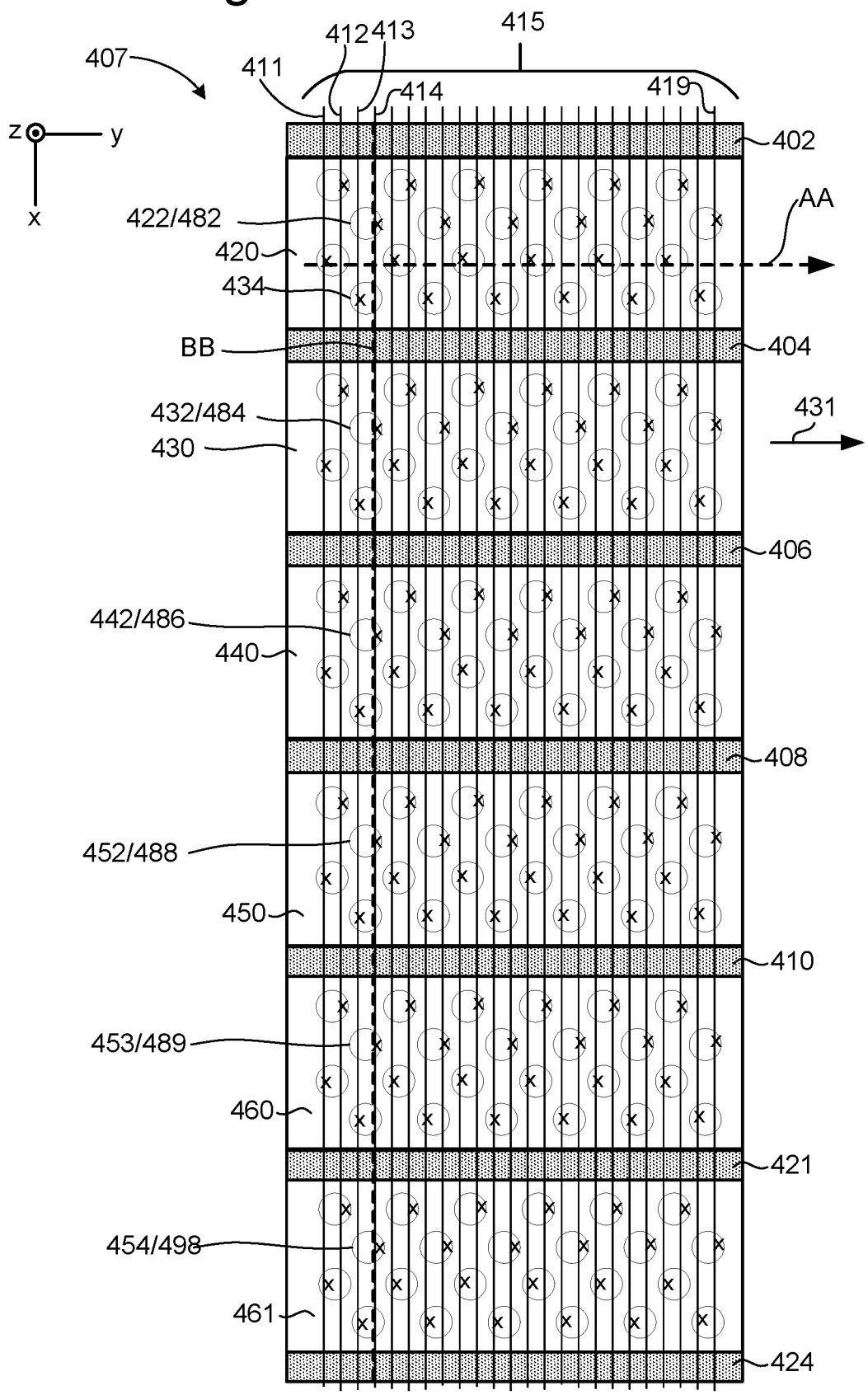
FIG. 4C is a block diagram depicting a top view of a portion 407 of one of the X Sub-Blocks in FIG. 4B.

FIG. 4C is a block diagram depicting a top view of a portion 407 of X Sub-Block 2a. As can be seen from FIG. 4C, the sub-block extends in the direction of arrow 431. In one embodiment, the memory array has many layers; however, FIG. 4C only shows the top layer (e.g., SGD layer).

FIG. 4C depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4C depicts vertical columns 422, 432, 442, 452, 453, and 454. Vertical column 422 implements NAND string 482. Vertical column 432 implements NAND string 484. Vertical column 442 implements NAND string 486. Vertical column 452 implements NAND string 488. Vertical column 453 implements NAND string 489. Vertical column 454 implements NAND string 498. More details of the vertical columns are provided below. Since the X sub-block extends in the direction of arrow 431, the X sub-block includes more vertical columns than depicted in FIG. 4C.

FIG. 4C also depicts a set of bit lines 415, including bit lines 411, 412, 413, 414, . . . 419. FIG. 4C shows twenty-four bit lines because only a portion of the X sub-block is depicted. It is contemplated that more than twenty-four bit lines connected to vertical columns of the X sub-block. Each of the circles representing vertical columns has an "x" to indicate its connection to one bit line. For example, bit line 414 is connected to vertical columns 422, 432, 442, 452, 453, 454. Note that although the columns 422, 432, 442, 452, 453, 454 are physically connected to the bit lines, the NAND string channels of NAND strings 482, 484, 486, 488, 489, 498 are not electrically connected to the bit lines at the same time. Rather, a drain side select gate on the NAND string may be used to electrically connect/disconnect the channel of NAND string to/from the bit line.

The X sub-block depicted in FIG. 4C includes a set of isolation regions 402, 404, 406, 408, 410, 421, and 424, which may be formed of $SiO_2$; however, other dielectric materials can also be used. Isolation regions 402, 404, 406, 408, 410, 421, and 424 serve to divide the top layers into six regions; for example, the top layer depicted in FIG. 4C is divided into regions 420, 430, 440, 450, 460, and 461. Each region 420, 430, 440, 450, 460, and 461 may serve as a drain side select line for a different XY sub-block.

In one embodiment, isolation regions 402 and 424 separate the block 407 from adjacent blocks. Thus, isolation regions 402 and 424 may extend down to the substrate. In one embodiment, the isolation regions 404, 406, 408, 410, and 421 only divide the layers used to implement drain side select gates so that NAND strings in different XY sub-blocks can be independently selected. In one example implementation, a bit line only connects to one vertical column/NAND string in each of regions 420, 430, 440, 450, 460, and 461. In that implementation, each block has twenty four rows of active columns and each bit line connects to a NAND string in six of the rows in each block. In one embodiment, all of the six vertical columns/NAND strings in a block connected to a common bit line are connected to the same set of word lines.

Although FIG. 4C shows each region having four rows of vertical columns, six regions and 24 rows of vertical columns in a block, those exact numbers are an example implementation. Other embodiments may include more or fewer regions per block, more or fewer rows of vertical columns per region and more or fewer rows of vertical columns per block. FIG. 4C also shows the vertical columns being staggered. In other embodiments, different patterns of staggering can be used. In some embodiments, the vertical columns are not staggered.

In an embodiment, the SGS layer will also be divided into the same number of regions as the SGD layer. In an embodiment the SGS layer of an X sub-block is divided into six regions that correspond to the regions 420, 430, 440, 450, 460, and 461 in the SGD layer depicted in FIG. 4C. Further details of the SGS layer are described below.

Figure 4D:
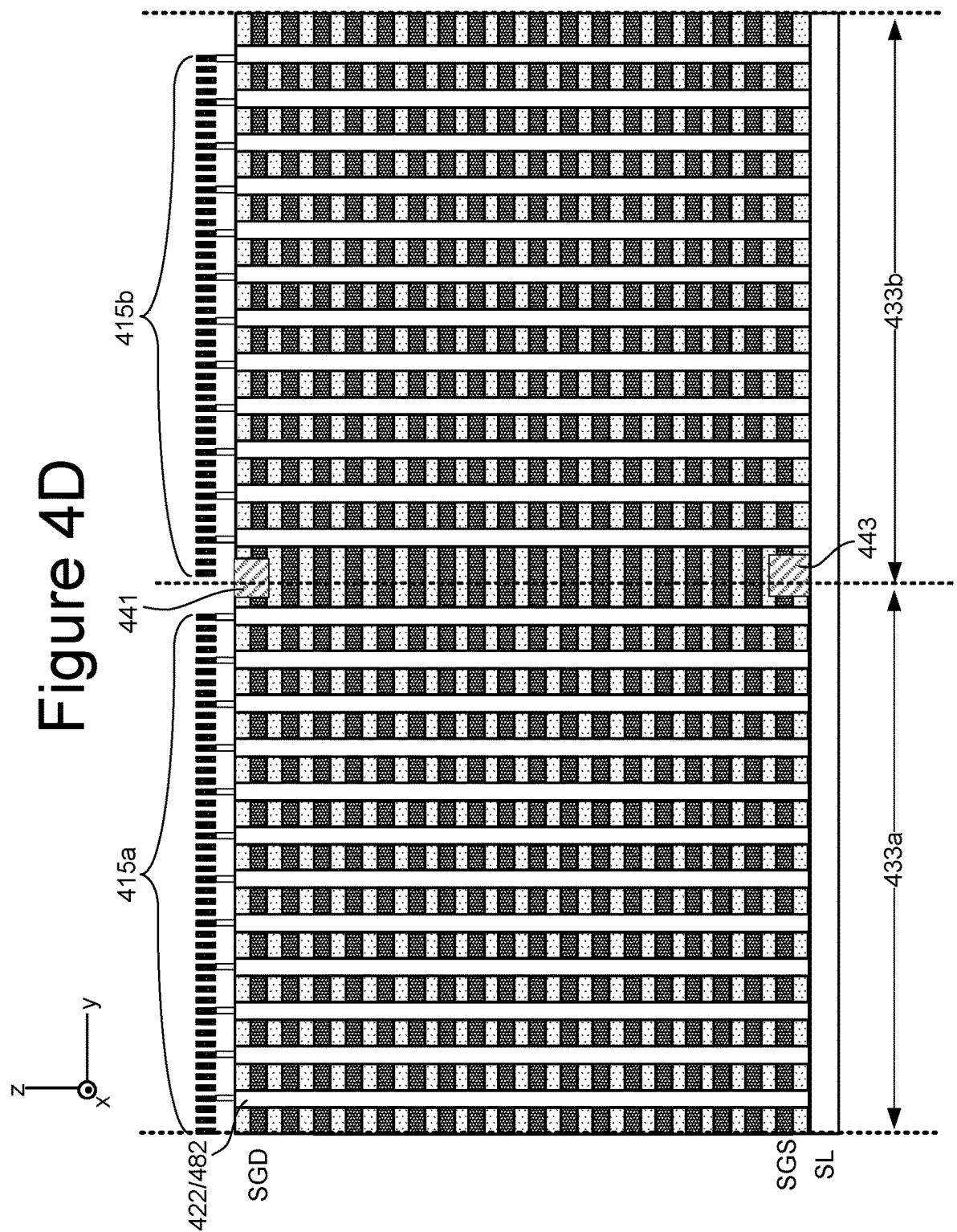
FIG. 4D depicts a cross-sectional view of a block along line AA in FIG. 4C.

FIG. 4D depicts a cross-sectional view of a block along line AA in FIG. 4C. The memory structure contains alternating of conductive layers and dielectric layers. The memory cells are arranged in NAND strings that extend in the z-direction through the alternating conductive layers and dielectric layers. Vertical column/NAND string 422/482 is depicted along with other vertical column/NAND strings. Only a few of the many vertical column/NAND string are depicted in FIG. 4D. There typically will be many more vertical column/NAND strings in each X sub-block 433. Also note that with respect to FIG. 4C there are many rows of NAND strings in a block (24 rows in the example in FIG. 4C). One or more of the conductive layers serves as the SGD. One or more of the conductive layers serves as the SGS. Other conductive layers may serve as word lines. The word line layers connect to memory cells. In an embodiment, each word line layer connects to each NAND string in the block. The drain side select layer SGD is used to electrically connect and disconnect (or cut off) the channels of respective NAND strings to/from bit lines. The source side select layer SGS is used to electrically connect and disconnect (or cut off) the channels of respective NAND strings to/from the source line SL.

The block is divided into two X sub-blocks 433a, 433b. The bit lines 415 are divided into a first contiguous group 415a that extend above X sub-block 433a and a second contiguous group 415b that extend above X sub-block 433b. The SGD is divided into two sections by SGD x-isolation structure 441. The SGS is divided into two sections by SGS x-isolation structure 443. There could be one or more additional SGD x-isolation structures 441 and a corresponding one or more additional SGS x-isolation structures 443 to divide the block into additional XY sub-blocks 433.

Figure 4E:
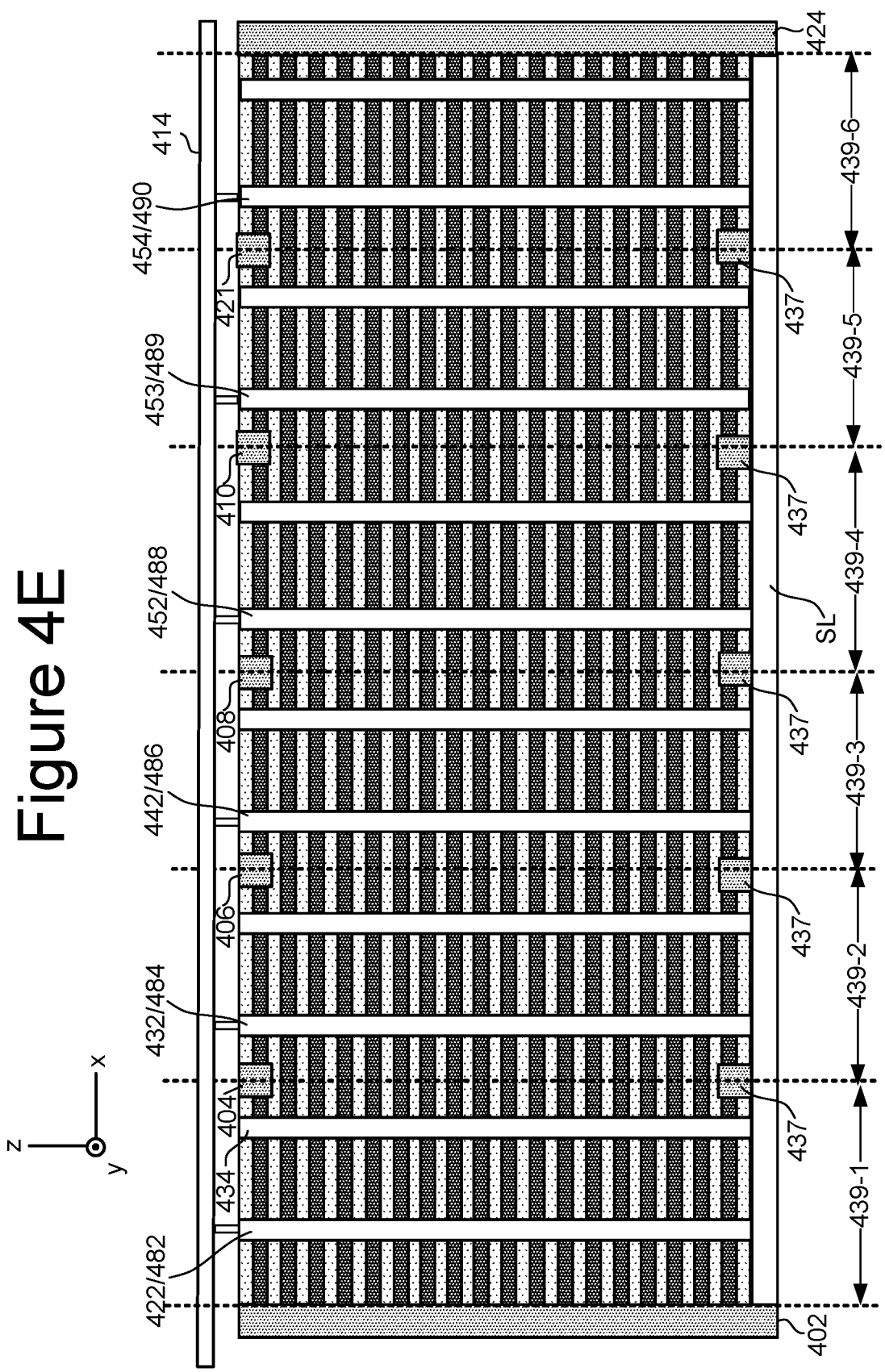
FIG. 4E depicts a cross-sectional view of a block along line BB in FIG. 4C.

FIG. 4E depicts a cross-sectional view of a block along line BB in FIG. 4C. The block is divided into a number of Y sub-blocks 439-1, 439-2, 439-3, 439-4, 439-5, and 439-6. Bit line 414 extends across the stack of alternative conductive and dielectric layers. Vertical columns/NAND strings 422/482, 432/484, 442/486, 452/488, 453/489, and 454/490 are depicted with their respective connections to the bit line 414. Vertical column 434 (and other vertical columns depicted in FIG. 4E) are not connected to bit line 414 (see also FIG. 4C). The various isolation structures 402, 404, 406, 408, 410, 421, and 424 can be seen in FIG. 4E. Note that isolation structures 404, 406, 408, 410, and 421 may serve as SGD y-isolation structures. Also depicted are SGS y-isolation structures 437. Each SGS y-isolation structure 437 extends in the y-direction.

Figure 5A:
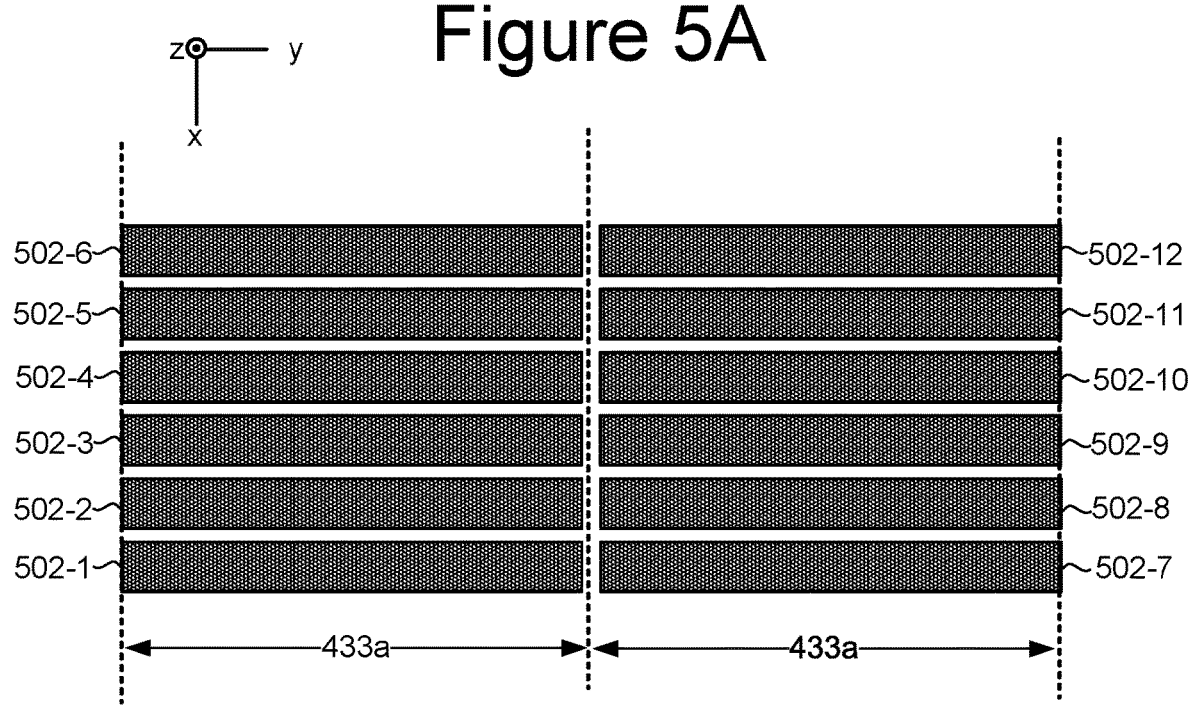
FIG. 5A depicts one embodiment of the source side select layer for a block.

FIG. 5A depicts one embodiment of the SGS layer for a block. The SGS layer is divided into twelve separate SGS lines 502-1 to 502-12 in this example. Each SGS line is in a different XY sub-block. The dashed lines indicate the borders of the two X sub-blocks 433a, 433b consistent with the example of FIG. 4D. Each X sub-block 433 is divided into six XY sub-blocks such that there are 12 XY sub-blocks in this example.

In an embodiment the SGD layer for the block is divided in the same way as the source side select layer. Thus, in an embodiment, the SGD layer also 12 SGD lines. Note that each XY sub-block contains a different set of contiguous NAND strings. By "contiguous NAND strings" it is meant that the NAND strings are grouped together with no intervening NAND strings. FIG. 4C shows contiguous NAND strings in region 420, contiguous NAND strings in region 430, etc.

Figure 5B:
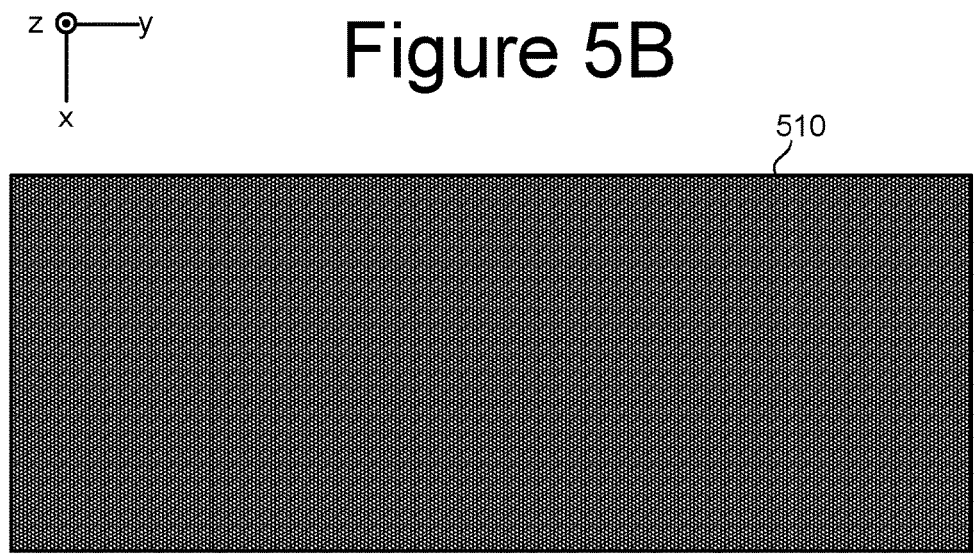
FIG. 5B depicts one embodiment of the source line (SL) layer of a block.

FIG. 5B depicts one embodiment of the source line (SL) layer 510 of a block. In an embodiment, the block has a single source line 510. Thus, in an embodiment, the same source line 510 connects to every NAND string in the block. In other embodiments, there is more than one source line in the block.

Figure 6A:
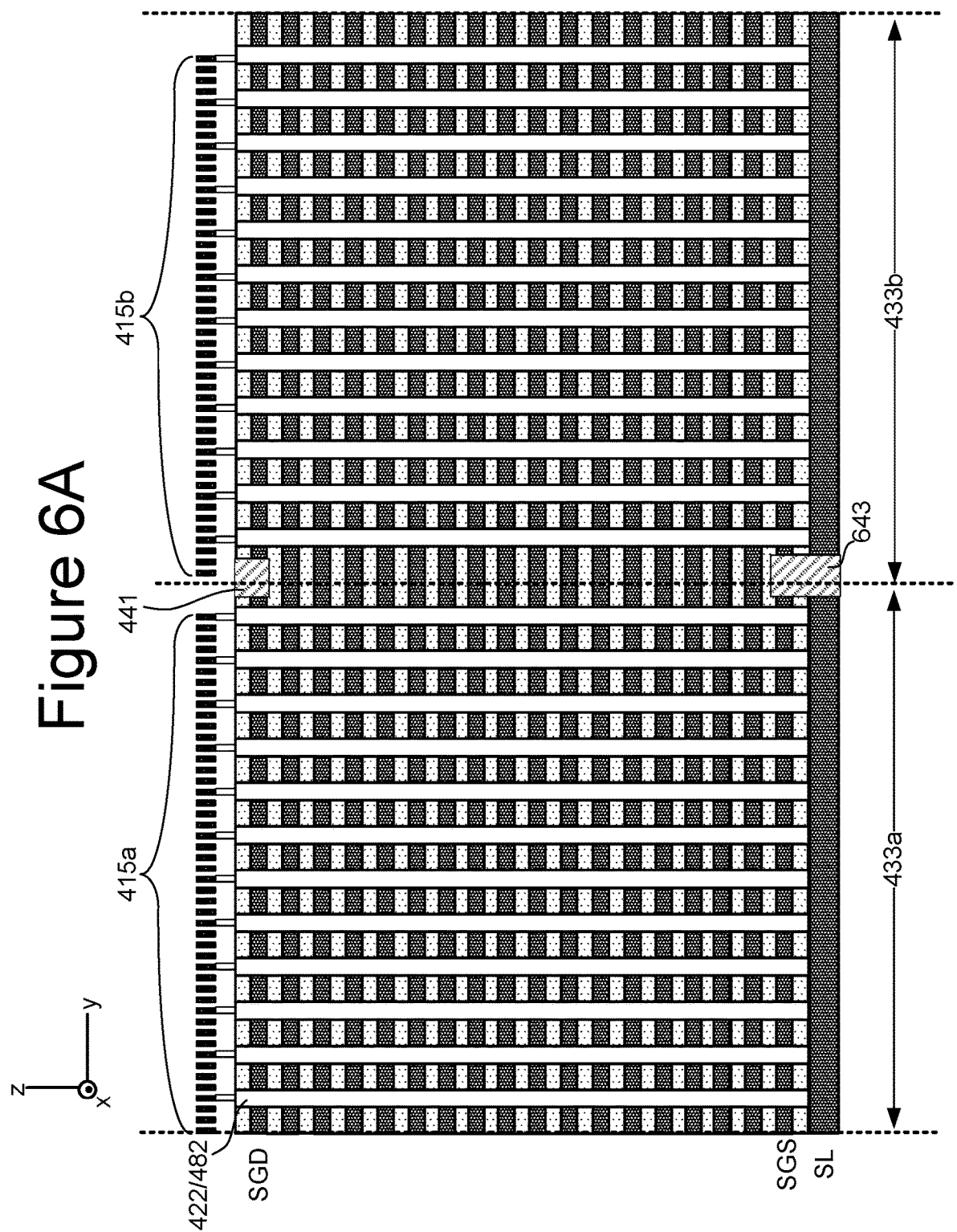
FIG. 6A depicts a cross-sectional view of an embodiment of a block along line AA in FIG. 4C.

FIG. 6A depicts a cross-sectional view of an embodiment of a block along line AA in FIG. 4C. An embodiment of FIG. 6A is similar to an embodiment of FIG. 4D, but has an SGS/SL x-isolation structure 643 instead of an SGS x-isolation structure 443 (see FIG. 4D). Referring to FIG. 6A, SGS/SL x-isolation structure 643 divides both the SGS layer and the SL into two regions. The SGS/SL x-isolation structure 643 extends in the x-direction and may be referred to as an "x-cut". The block is divided into two X sub-blocks 433a, 433b. The bit lines 415 are divided into a first contiguous group 415a that extend above X sub-block 433a and a second contiguous group 415b that extend above X sub-block 433b. Vertical column/NAND string 422/482 is depicted along with other vertical column/NAND strings. There may be more than one SGS/SL x-isolation structure 643 and a corresponding more than one SGD x-isolation structure 441 in order to divide the block into more than two X sub-blocks 433.

Figure 6B:
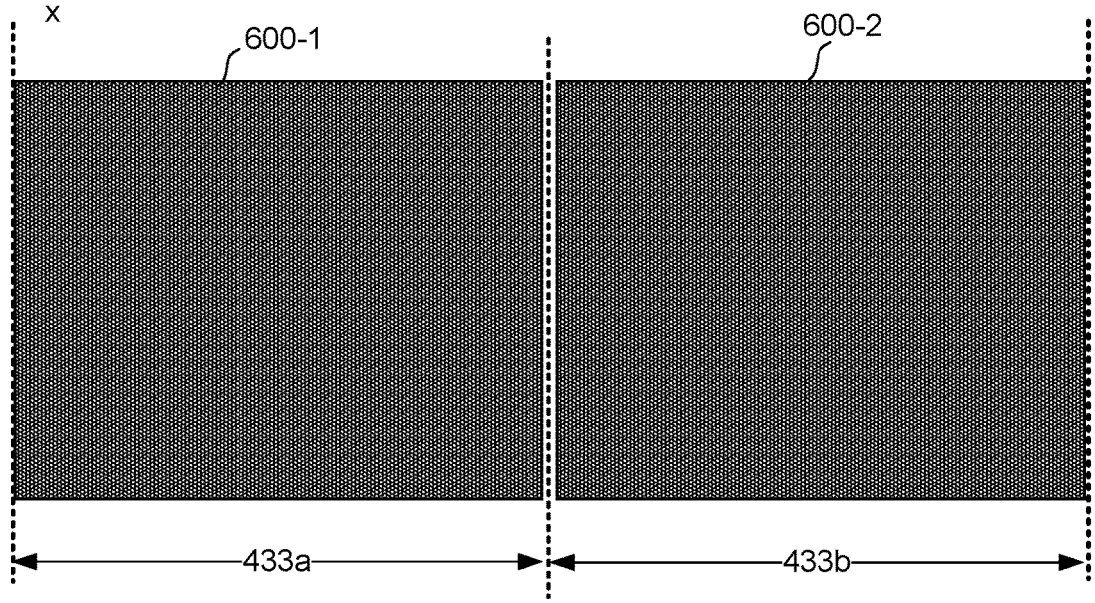
FIG. 6B depicts one embodiment of the source line (SL) layer of a block having two source lines.

FIG. 6B depicts one embodiment of the source line (SL) layer of a block. In this embodiment, the block has a two source line regions 600-1, 600-2. One source line region 600-1 is a first X sub-block 433a and the other source line region 600-2 is a second X sub-block 433b. Thus, in this embodiment, source line region 600-1 will connect to all of the NAND strings in the first X sub-block 433a, whereas source line region 600-2 will connect to all of the NAND strings in the second X sub-block 433b. In an embodiment of the structure of FIG. 6A, the source line has two regions 600-1, 600-2.

Figure 6C:
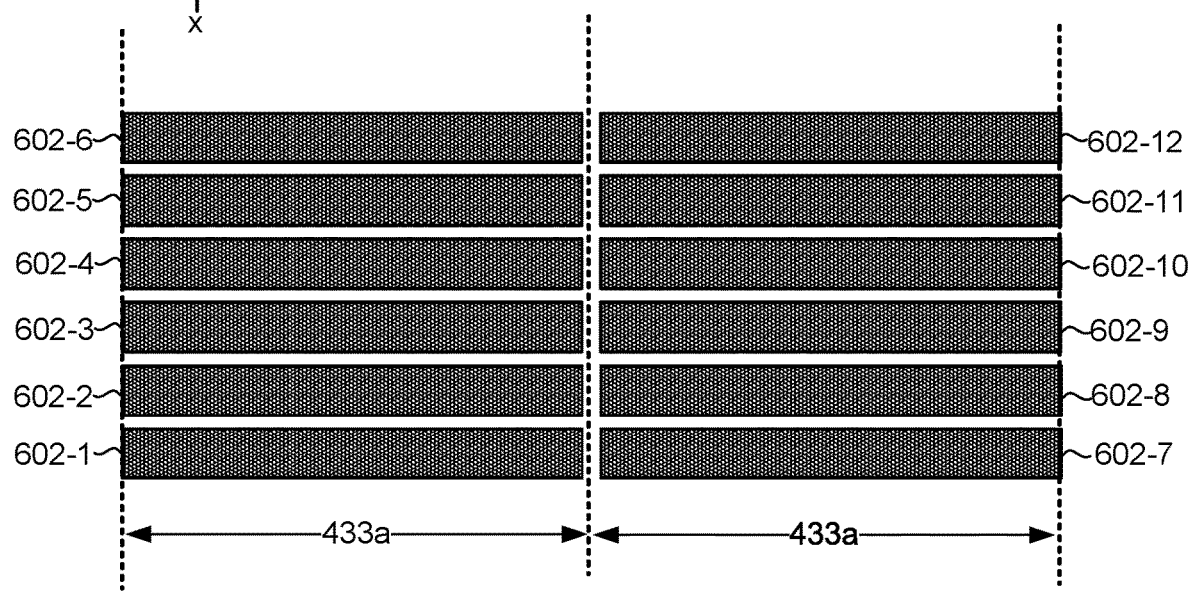
FIG. 6C depicts one embodiment of the source line (SL) layer of a block having a source line for each XY sub-block.

FIG. 6C depicts one embodiment of the source line (SL) layer of a block. In this embodiment, the block has a 12 source line regions 602-1 to 602-12. Each source line region 602 is in a different XY sub-block. Thus, in this embodiment, source line region 602-1 will connect to all of the NAND strings in a first XY sub-block, source line region 602-2 will connect to all of the NAND strings in a second XY sub-block, etc. In an embodiment of the structure of FIG. 6A, the source line has a separate regions for each XY sub-block. For example, the source line may have 12 regions 602-1 to 602-12, as depicted in FIG. 6C.

Figure 6D:
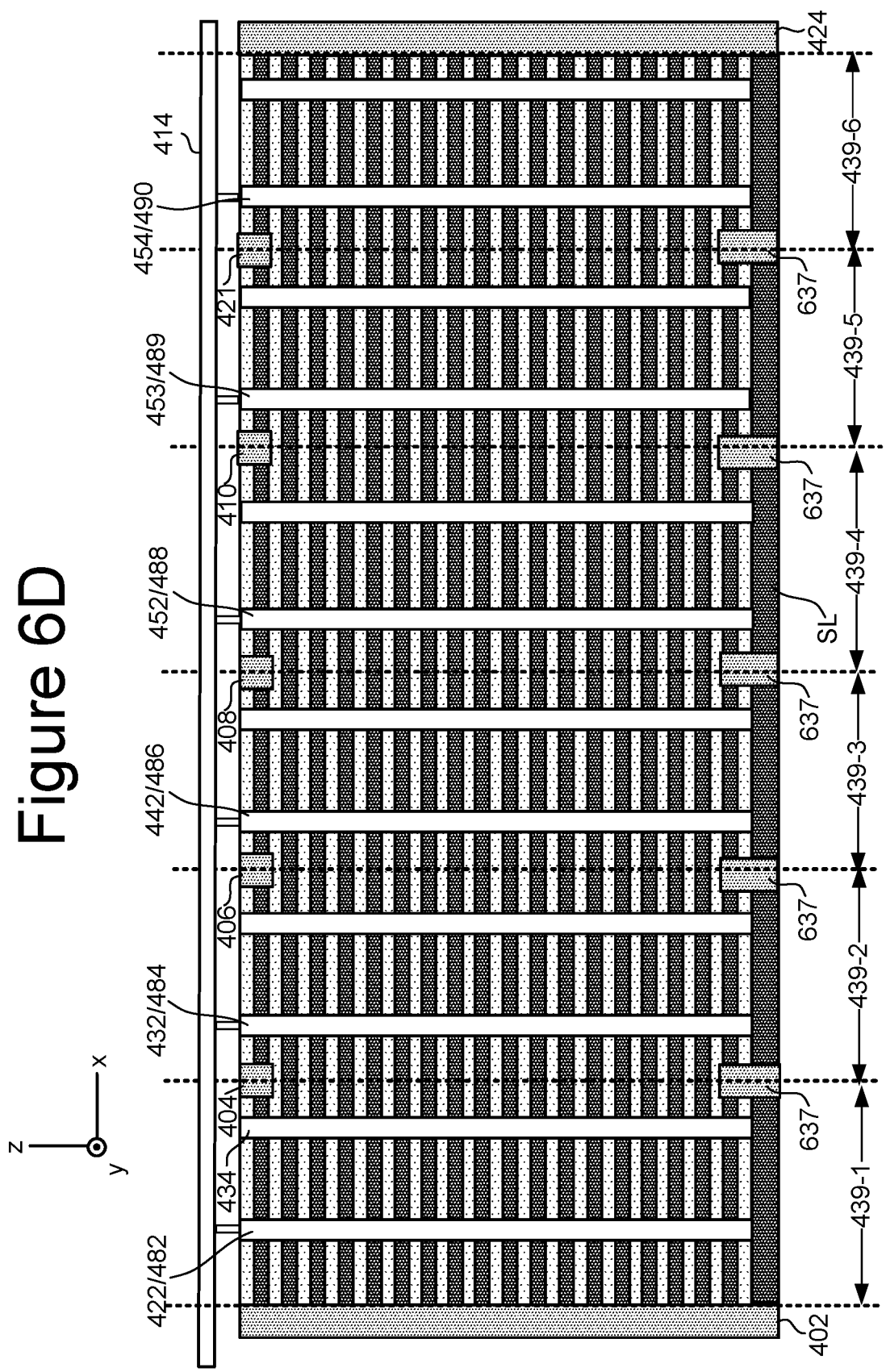
FIG. 6D depicts a cross-sectional view of an embodiment of a block along line BB in FIG. 4C.

FIG. 6D depicts a cross-sectional view of an embodiment of a block along line BB in FIG. 4C. An embodiment of FIG. 6D is similar to an embodiment of FIG. 4E, but has an SGS/SL y-isolation structures 637 instead of SGS y-isolation structures 437 (see FIG. 4E). The block is divided into a number of Y sub-blocks 439-1, 439-2, 439-3, 439-4, 439-5, and 439-6. Each XY sub-block has its own source line in an embodiment of FIG. 6D. Thus the source line may have 12 source line regions 602-1 to 602-12 in an example in which there are 12 XY sub-blocks.

Figure 7:
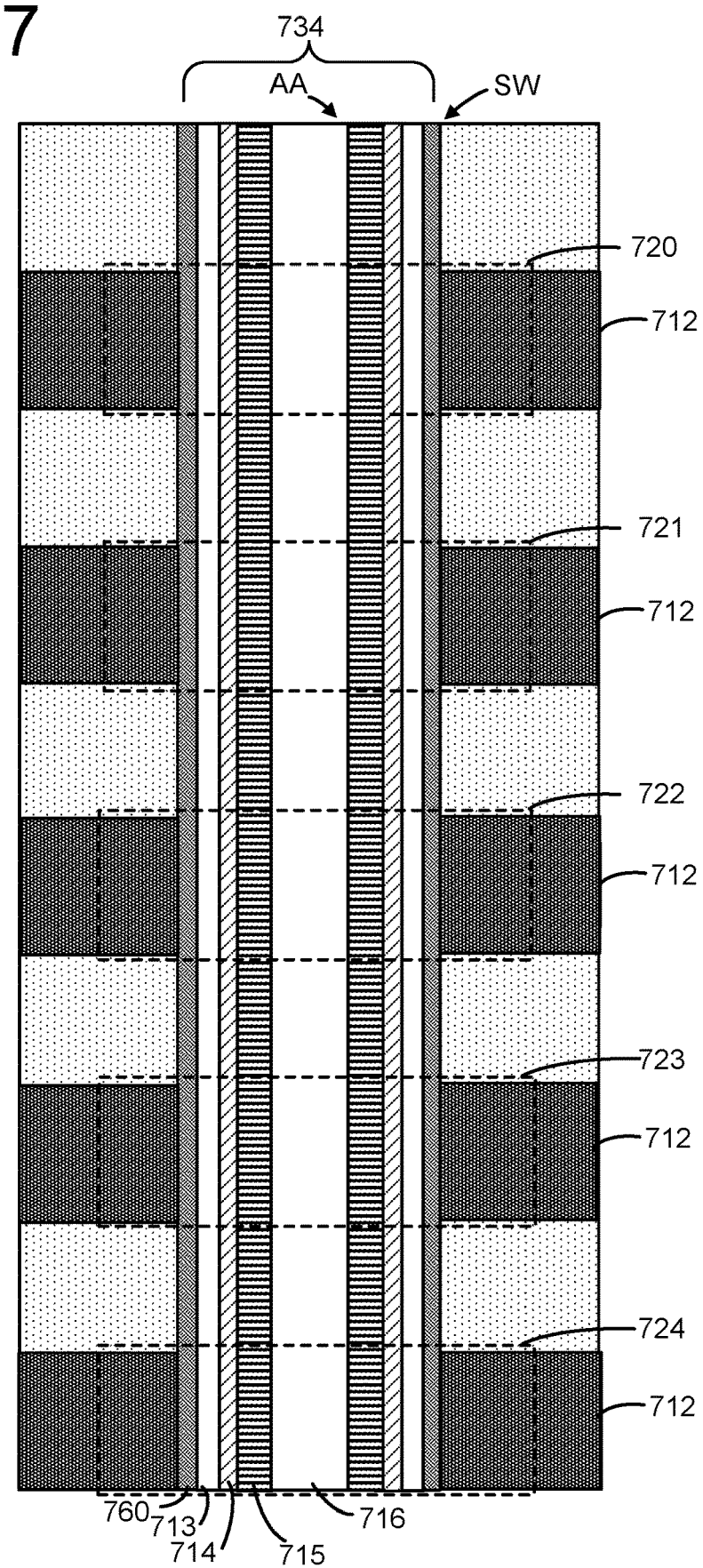
FIG. 7 depicts further details of a portion of one embodiment of a NAND string.

FIG. 7 depicts further details of a portion of one embodiment of a NAND string. Data memory cell transistors 720, 721, 722, 723, and 724 are indicated by the dashed lines. A number of layers can be deposited along the sidewall (SW) of the memory hole 734 and/or within each word line layer, e.g., using atomic layer deposition. For example, each column (e.g., the pillar which is formed by the materials within a memory hole) can include a blocking oxide/block high-k material 760, charge-trapping layer or film 713 such as SiN or other nitride, a tunneling layer 714, a polysilicon body or channel 715, and a dielectric core 716. A word line layer can include a conductive metal 712 such as Tungsten as a control gate. A portion of the conductive metal 712 adjacent the cell serves as a control gate. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 714 can comprise multiple layers such as in an oxide-nitride-oxide configuration.

Figure 8:
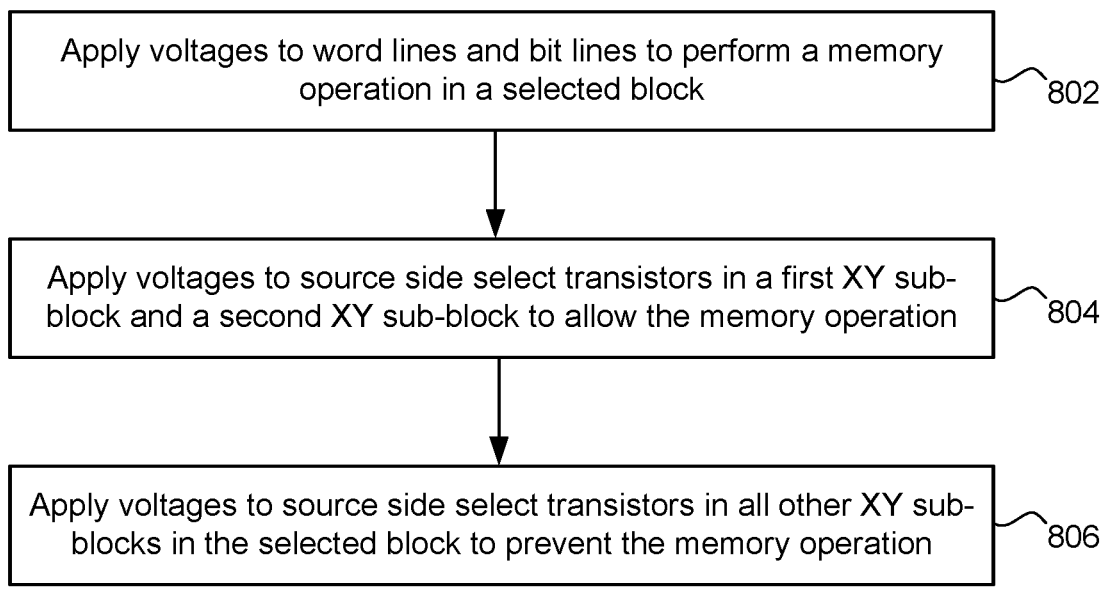
FIG. 8 depicts a flowchart of one embodiment of a process of performing memory operations in multiple XY sub-blocks in a block in parallel.

FIG. 8 depicts a flowchart of one embodiment of a process 800 of performing memory operations in multiple XY sub-blocks in a block in parallel. Each XY sub-block for which parallel operation is performed are associated with a different set of contiguous bit lines. Moreover, the memory operation is prevented (or inhibited) in all other XY sub-block in the block. Process 800 will be discussed with respect to an example of a first XY sub-block in first X sub-block 433*a* and a second XY sub-block in second X sub-block 433*b*; however, if more X sub-blocks 433 are present in the block then the memory operation may be performed in parallel on more XY sub-blocks. In one embodiment, the memory operation is a program operation. In one embodiment, the memory operation is an erase operation. The block will have one or more source lines. In one embodiment, the block has a single source line. In one embodiment, the block has one source line for each X sub-block. In one embodiment, the block has one source line for each XY sub-block.

Step 802 includes applying voltages to word lines and bit lines to perform a memory operation within a selected block. The term "selected block" as used herein means the block that contains memory cells that undergo the memory operation. As will be clear from the discussion some of the memory cells in the selected block may be inhibited or prevented from undergoing the memory operation. For example, some XY sub-blocks may be selected for the memory operation, whereas other XY sub-blocks may be inhibited/prevented from undergoing the memory operation. In one embodiment, a program voltage is applied to a selected word line and a boosting voltage is applied to unselected word lines. Herein, the term "selected word line" in the context of programming means the word line to which the program voltage is applied. As will be clear to one of ordinary skill in the art from this description, some memory cells ("selected memory cells) connected to the selected word line will receive programming, whereas other memory cells connected to the selected word line will be inhibited from programming. An "unselected word line" as the term is used herein in the context of programming herein means a word line for which the program voltage is not applied, such that no memory cell connected thereto receives programming. Also in step 802, voltages are applied to the bit lines to either enable programming or inhibit programming. Further details of embodiments in which the memory operation is a program operation are described in connection with FIGS. 9 and 10. In one embodiment, an erase voltage is applied to the bit lines and an erase enable voltage is applied to the word lines. Further details of embodiments in which the memory operation is an erase operation is described in connection with FIGS. 11 and 12.

Step 804 includes applying voltages to source side select transistors in a first XY sub-block and a second XY sub-block to allow the memory operation. Note that during a typical NAND program operation some memory cells a group of memory cells undergoing programming will receive programming but others in that group may be inhibited for reasons such as their Vt already being at the target Vt. Allowing the memory operation in the context of a program operation does not require that every memory cell in the group of memory cells undergoing programming will receive programming due to factors such as some memory cells in that group being inhibited for reasons such as their Vt already being at the target Vt. Step 804 may include applying a voltage to the control terminal of the respective source side select transistors by way of the source side select line (SGS). In the example of FIG. 5A, the voltage may be applied to any one of SGS lines 502-1 to 502-6 and to any one of SGS lines 502-7 to 502-12. For purpose of discussion an example will be described in which the XY sub-blocks having SGS lines 502-2 and 502-11 are selected for the memory operation. In this example, the voltage may be applied to SGS lines 502-2 and 502-11 (see FIG. 5A). Step 804 may also include applying a voltage to whatever source line(s) is/are connected to the NAND strings in the first XY sub-block and the second XY sub-block. In one embodiment, a voltage is applied to a single source line 510 in the block (see FIG. 5B). In one embodiment, a voltage is applied to a different source line 600 for each X sub-block in the block (see FIG. 6B). In one embodiment, a voltage is applied to a first source line 602 that is in the first XY sub-block and second source line in the second XY sub-block. In the example of FIG. 6C, the voltage may be applied to source lines 602-2 and 602-11.

Step 806 includes applying voltages to source side select transistors in all other XY sub-blocks in the selected block to inhibit the memory operation. Step 806 may include applying a voltage to the control terminal of the respective source side select transistors by way of the source side select line (SGS) of all other XY sub-blocks in the block. In the example of FIG. 5A, the voltage may be applied to source select lines 502-1, 502-3, 502-4, 502-5, 502-6, 502-7, 502-8, 502-9, 502-10, and 502-12. Step 806 may also include applying a voltage to whatever source line(s) is connected to the NAND strings all other XY sub-blocks. Note that if there is only one source line per block or only one source line per X sub-block then the voltage may be applied in step 804. However, if the source line layer is divided as in FIG. 6C, then a voltage may be applied to source lines 602-1, 602-3, 602-4, 602-5, 602-6, 602-7, 602-8, 602-9, 602-10, and 602-12 in step 806 that is different from the voltage applied to source lines 602-2 and 602-11.

Figure 9:
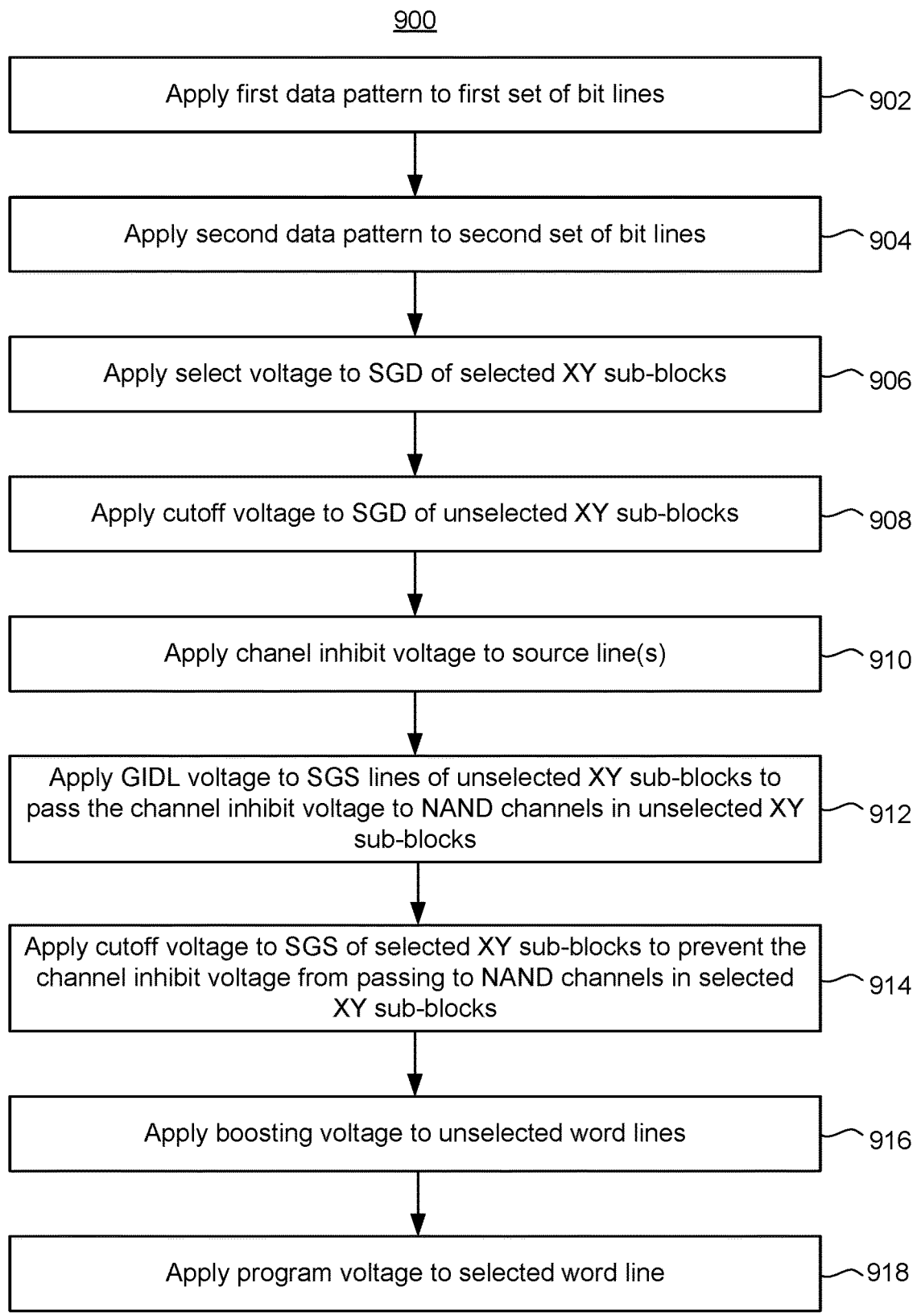
FIG. 9 depicts a flowchart of one embodiment of a process of performing a program operation in multiple XY sub-blocks in a block in parallel.

FIG. 9 depicts a flowchart of one embodiment of a process 900 of performing a program operation in multiple XY sub-blocks in a block in parallel. The process 900 provides further details of an embodiment of process 800. The steps are described in a certain order for convenience of explanation. The steps could be performed in a different order. Some steps could occur at the same time. In one embodiment of process 900 the block has a single source line. For example, with reference to FIG. 5B, there is a single source line 510 for the block. In one embodiment of process 900 the block has one source line in each X sub-block. For example, with reference to FIG. 6B, there is a source line 600-1 for X sub-block 433*a* and a source line 600-2 for XY sub-block 433b. There could be more than two X sub-blocks 433, and therefore, more than two source lines 600 in the block.

Step 902 includes applying a first data pattern to first set of bit lines. Step 904 includes applying a second data pattern to second set of bit lines. The first set of bit lines may be the bit lines 415a. The second set of bit lines may be the bit lines 415b. The data patterns may be applied by applying a program enable voltage (e.g., 0V) to bit lines connected to a memory cell to receive programming and applying a program inhibit voltage (e.g., 2.2V) to bit lines not connected to any memory cell to receive programming. The program enable voltage will facilitate setting up a channel condition (e.g., 0V in channel) to enable programming of a memory cell in a selected XY sub-block that receives the program voltage. The program inhibit voltage will facilitate setting up a boosted channel condition (along with the boosting voltage of step 916) to inhibit programming of a memory cell in a selected XY sub-block even if that memory cell receives the program voltage.

Step 906 includes applying a select voltage (e.g., Vsgd) to the SGD of selected XY sub-blocks. A "select voltage" in connection with a drain side select gate as the term is defined herein is a voltage that is used to select an XY sub-block for a memory operation. In an embodiment, the select voltage has a magnitude that causes the drain side select transistors connected to bit lines receiving the program enable voltage to be on but that causes the drain side select transistors connected to bit lines receiving the program inhibit voltage to be off.

Step 908 includes applying a cutoff voltage to the SGD of all unselected XY sub-blocks in the block. A "cutoff voltage" is defined herein as a voltage applied to a control gate of a select transistor that will keep the select transistor off, factoring in a voltage on a bit line for a drain side select transistor or a source line for a source side select transistor. The cutoff voltage of step 906 has a magnitude that will keep the drain side select transistors in all unselected XY sub-blocks off. Therefore, the channels of all NAND strings in the unselected XY sub-blocks will be electrically disconnected (or cut off) from the bit lines.

Step 910 includes applying a channel inhibit voltage to the source line(s). In one embodiment, the channel inhibit voltage has a magnitude that is approximately (Vpgm+Vpass)/2, where Vpgm is the programming voltage and Vpass is a boosting voltage to be discussed below. In one embodiment, the same voltage is applied to the source line in each X sub-block. The channel inhibit voltage will be passed to channels of NAND strings in XY sub-blocks that are not to be programmed. The term "channel inhibit voltage" as defined herein is a voltage that when present in a channel of a NAND string will inhibit programming of memory cells regardless of whether program voltage or boosting voltage is applied to the control gate of the memory cell and regardless of whether the bit line receives the program enable voltage or the program inhibit voltage. For example, the channel inhibit voltage may be of sufficient magnitude such that even if the program voltage is applied to the control gate of the memory cell the memory cell will be inhibited from programming.

Step 912 includes applying a gate-induced drain leakage (GIDL) voltage to the source side select lines of unselected XY sub-blocks to pass the channel inhibit voltage to NAND channels in unselected XY sub-blocks. In one embodiment, the GIDL voltage is about 11.5V less than the voltage applied to the source line. The combination of the GIDL voltage and the source line voltage will generate a GIDL current, in an embodiment. With reference to the example SGS layer in FIG. 5A, the GIDL voltage may be applied to source select lines 502-1, 502-3, 502-4, 502-5, 502-6, 502-7, 502-8, 502-9, 502-10, and 502-12.

Step 914 includes applying cutoff voltage to SGS of selected XY sub-blocks to prevent the channel inhibit voltage from passing to NAND channels in selected XY sub-blocks. The cutoff voltage has a magnitude that will keep the source side select transistors in the selected XY sub-blocks off. Therefore, the channels of all NAND strings in the selected XY sub-blocks will be electrically disconnected (or cut off) from the source lines. Therefore, the channel inhibit voltage on the source line will not impact (e.g., will not inhibit) programming in the selected XY sub-blocks. With reference to the example of FIG. 5A, the cutoff voltage may be applied to source select lines 502-2 and 502-11.

Step 916 includes applying a boosting voltage to unselected word lines in the selected block. The boosting voltage (Vpass) has a magnitude that is substantially lower than Vpgm. For example, Vpgm may be 20V or higher, whereas Vpass may be about 12V. However, these are just examples for Vpgm and Vpass, those of ordinary skill will realize that other magnitudes may be used for programming and boosting. The channels of NAND strings in the selected XY sub-blocks that are to be inhibited from programming (based on bit line bias) will be floating. The boosting voltage will couple up the potential of the (floating) NAND channels in the selected XY sub-blocks, which will inhibit programming for memory cells that are not to be programmed in the selected XY sub-blocks.

Step 918 includes applying a program voltage to the selected word line. Memory cells in the selected XY sub-blocks that are on NAND strings connected to bit lines receiving the program enable voltage and that are connected to the selected word line will receiving programming. However, memory cells in the selected XY sub-blocks that are on NAND strings connected to bit lines receiving the program inhibit voltage will not receive programming (even if connected to the selected word line). Moreover, none of the memory cells in the unselected XY sub-blocks will receive programming.

Figure 10:
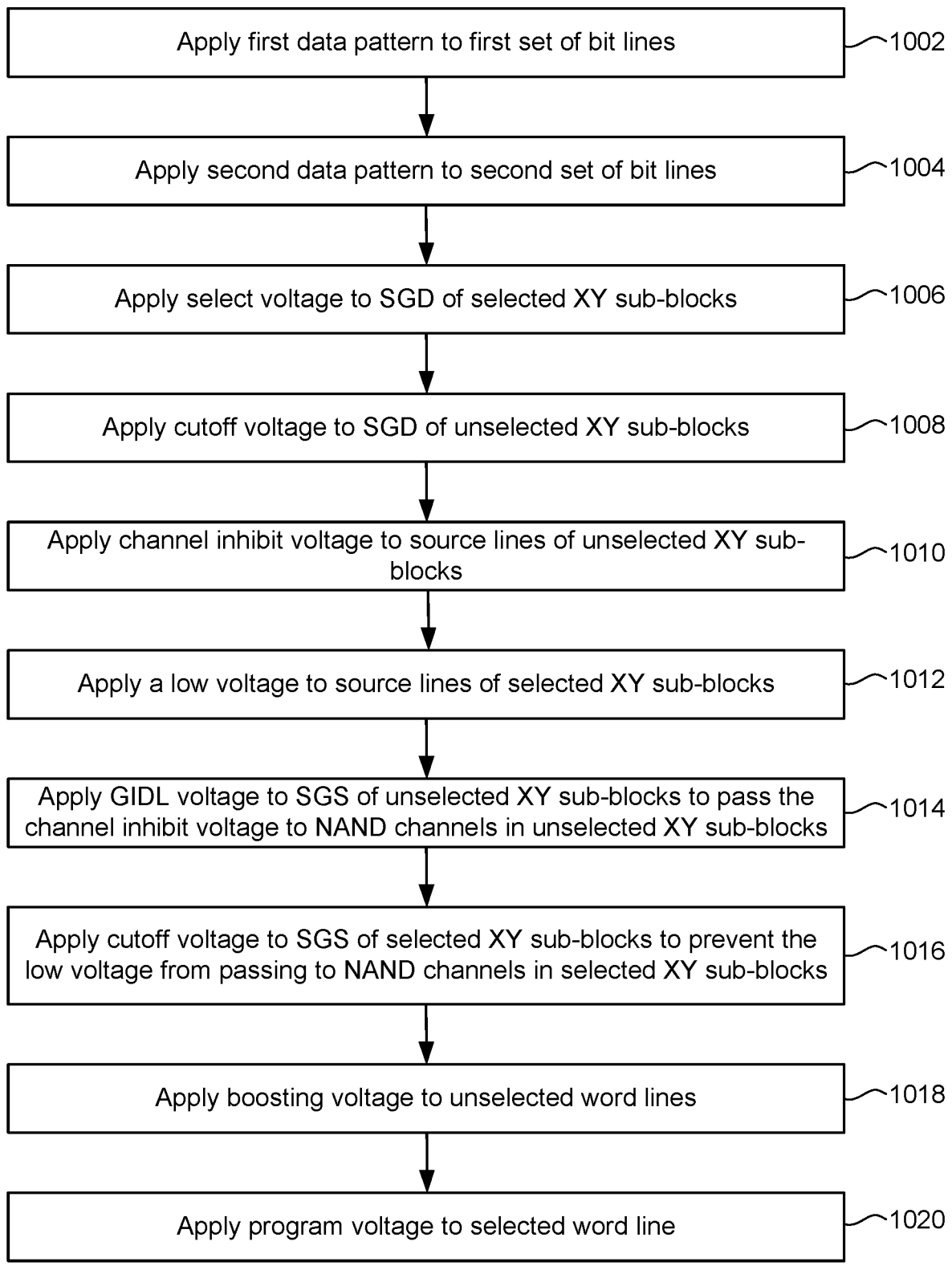
FIG. 10 depicts a flowchart of one embodiment of a process of performing a program operation in multiple XY sub-blocks in a block in parallel in which each XY sub-block has its own source line.

FIG. 10 depicts a flowchart of one embodiment of a process 1000 of performing a program operation in multiple XY sub-blocks in a block in parallel. The process 1000 provides further details of an embodiment of process 800. The steps are described in a certain order for convenience of explanation. The steps could be performed in a different order. Steps could occur at the same time. In one embodiment of process 1000 the block has a source line for each XY sub-block. For example, FIG. 6C depicts an example source line layer having a source line 602-1 to 602-12 for each of 12 XY sub-blocks. There may, however, be more or fewer than 12 XY sub-blocks in a block. Some steps of process 1000 are similar to corresponding steps in process 900 and will be described only briefly.

Step 1002 includes applying a first data pattern to a first set of contiguous bit lines. Step 1004 includes applying a second data pattern to second set of contiguous bit lines. Step 1006 includes applying a select voltage (e.g., Vsgd) to the SGD of selected XY sub-blocks. Step 1008 includes applying a cutoff voltage to the SGD of all unselected XY sub-blocks in the block.

Step 1010 includes applying a channel inhibit voltage to the source lines of unselected XY sub-blocks. For example, with reference to FIG. 6C an example will be discussed in which source line 602-2 and source line 602-11 are in the selected XY sub-blocks. Thus, in step 1010 the channel inhibit voltage will be applied to source lines 602-1, 602-3, 602-4, 602-5, 602-6, 602-7, 602-8, 602-9, 602-10, and 602-12.

Step 1012 includes applying a low voltage to the source lines of the selected XY sub-blocks. The low voltage has a substantially smaller magnitude than the channel inhibit voltage that is applied to the source lines of unselected XT sub-blocks. An example of the low voltage is about 1.5V. With reference to the example of FIG. 6C, the low voltage will be applied to source lines 602-2 and 602-11.

Step 1014 includes applying a voltage to the source side select lines of the unselected XY sub-blocks to pass the channel inhibit voltage from the source lines to NAND channels in unselected XY sub-blocks. In one embodiment, the voltage is about 11.5V less than the voltage applied to the source line. The combination of this voltage and the source line voltage will generate a gate induced drain leakage (GIDL) current, in an embodiment. With reference to the example SGS layer in FIG. 5A, the voltage may be applied to source select lines 502-1, 502-3, 502-4, 502-5, 502-6, 502-7, 502-8, 502-9, 502-10, and 502-12.

Step 1016 includes applying cutoff voltage to SGS of selected XY sub-blocks to prevent the low voltage from passing to NAND channels in selected XY sub-blocks. The cutoff voltage has a magnitude that will keep the source side select transistors in the selected XY sub-blocks off. Therefore, the channels of all NAND strings in the selected XY sub-blocks will be electrically disconnected (or cut off) from the source lines. Therefore, the low voltage on the source lines will not impact (e.g., will not inhibit) programming in the selected XY sub-blocks. With reference to the example of FIG. 5A, the cutoff voltage may be applied to source select lines 502-2 and 502-11.

Step 1018 includes applying a boosting voltage to unselected word lines in the selected block. Step 1020 includes applying program voltage to the selected word line. Memory cells in the selected XY sub-blocks that are on NAND strings connected to bit lines receiving the program enable voltage and that are connected to the selected word line will receiving programming. However, memory cells in the selected XY sub-blocks that are on NAND strings connected to bit lines receiving the program inhibit voltage will not receive programming (even if connected to the selected word line. Moreover, none of the memory cells in the unselected XY sub-blocks will receive programming.

FIG. 11 depicts a flowchart of one embodiment of a process 1100 of performing an erase operation in multiple XY sub-blocks in a block in parallel. Each of the XY sub-blocks that are erased are connected to a different set of contiguous bit lines. Process 1100 will prevent erase of other XY sub-blocks in the block. The process 1100 provides further details of an embodiment of process 800. The steps are described in a certain order for convenience of explanation. The steps could be performed in a different order. Steps could occur at the same time. In one embodiment of process 1100 the block has a single source line. For example, with reference to FIG. 5B, there is a single source line 510 in the block. In one embodiment of process 1100 the block has one source line in each X sub-block. For example, with reference to FIG. 6B, there is a source line 600-1 for X sub-block 433a and a source line 600-2 for XY sub-block 433b. There could be more than two X sub-blocks 433, and therefore, more than two source lines 600 in the block.

Step 1102 includes applying an erase voltage to the bit lines. The bit lines may include a first set of contiguous bit lines and a second set of contiguous bit lines. The first set of contiguous bit lines may be the bit lines 415a. The second set of contiguous bit lines may be the bit lines 415b. Step 1104 includes applying the erase voltage the source lines. With reference to the example of FIG. 5B, the erase voltage may be applied to source line 510. With reference to the example of FIG. 6B, the erase voltage may be applied to source lines 600-1 and 600-2. In an embodiment, the erase voltage (Vera) has a magnitude of about 20V.

Step 1106 includes applying a GIDL voltage (e.g., Vgidl) to the SGD of selected XY sub-blocks. In an embodiment, the GIDL voltage has a magnitude that creates a GIDL current in the drain side select transistors, given the magnitude of Vera on the bit lines. The GIDL voltage may be about 11.5V lower than the erase voltage. The erase voltage will pass from the bit lines to the channels of the NAND strings in the selected XY sub-blocks.

Step 1108 includes applying a cutoff voltage to the SGD of all unselected XY sub-blocks in the block. The cutoff voltage has a magnitude that will keep the drain side select transistors in all unselected XY sub-blocks off. Therefore, the channels of all NAND strings in the unselected XY sub-blocks will be electrically disconnected (or cut off) from the bit lines. An example of the cutoff voltage is 0V.

Step 1110 includes applying an erase enable voltage to the word lines in the block. The erase enable voltage will enable erase of memory cells connected to the word lines, assuming that the erase voltage is present in the memory cell channel. An example magnitude of the erase enable voltage is 0.5V.

Step 1112 includes applying a GIDL voltage to the source side select lines (SGS) of selected XY sub-blocks to pass the erase voltage from the source line(s) to NAND channels in selected XY sub-blocks. In one embodiment, the voltage is about 11.5V less than the voltage applied to the source line. The combination of this voltage and the source line voltage will generate a GIDL current, in an embodiment. With reference to FIG. 5A an example will be discussed in which source lines 502-2 and source line 502-11 are in the selected XY sub-blocks. Hence, the GIDL voltage may be applied to source select lines 502-2 and 502-11.

Step 1114 includes applying cutoff voltage to SGS of unselected XY sub-blocks to prevent the erase voltage from passing to NAND channels in unselected XY sub-blocks. The cutoff voltage has a magnitude that will keep the source side select transistors in the unselected XY sub-blocks off. Therefore, the channels of all NAND strings in the unselected XY sub-blocks will be electrically disconnected (or cut off) from the source lines. Therefore, the erase voltage on the source lines will not reach the channels of the NAND strings in the unselected XY sub-blocks, whereby erase of those NAND strings is prevented. As example of the cutoff voltage is 0V. With reference to FIG. 5A the cutoff voltage may be applied to source select lines 502-1, 502-3, 502-4, 502-5, 502-6, 502-7, 502-8, 502-9, 502-10, and 502-12.

FIG. 12 depicts a flowchart of one embodiment of a process 1200 of performing an erase operation in multiple XY sub-blocks in a block in parallel. Each of the XY sub-blocks that are erased are connected to a different set of contiguous bit lines. Process 1200 will prevent erase of other XY sub-blocks in the block. The process 1200 provides further details of an embodiment of process 800. The steps are described in a certain order for convenience of explanation. The steps could be performed in a different order. Steps could occur at the same time. In one embodiment of process 1200 the block has a source line for each XY sub-block. For example, FIG. 6C depicts an example source line layer having a source line 602-1 to 602-12 for each of 12 XY sub-blocks. There may, however, be more or fewer than 12 XY sub-blocks in a block. Some steps of process 1200 are similar to corresponding steps in process 1100 and will be described only briefly.

Step 1202 includes applying an erase voltage to the bit lines. The bit lines may include a first set of contiguous bit lines and a second set of contiguous bit lines. Step 1204 includes applying the erase voltage the source lines of the selected XY sub-blocks. However, the erase voltage is not applied to the source lines of the unselected XY sub-blocks. For example, with reference to the example of FIG. 6C the erase voltage may be applied to source line 602-2 and 602-11. In an embodiment, the erase voltage (Vera) has a magnitude of about 20V.

Step 1206 includes floating the source lines of the unselected XY sub-blocks. For example, source lines 602-1, 602-3, 602-4, 602-5, 602-6, 602-7, 602-8, 602-9, 602-10, and 602-12 may be floated. In another embodiment, source lines 602-1, 602-3, 602-4, 602-5, 602-6, 602-7, 602-8, 602-9, 602-10, and 602-12 are grounded.

Step 1208 includes applying a GIDL voltage (e.g., Vgidl) to the SGD of selected XY sub-blocks. The erase voltage will pass from the bit lines to the channels of the NAND strings in the selected XY sub-blocks. Step 1210 includes applying a cutoff voltage to the SGD of all unselected XY sub-blocks in the block. An example of the cutoff voltage is 0V.

Step 1212 includes applying an erase enable voltage to the word lines in the block. An example magnitude of the erase enable voltage is 0.5V. Step 1214 includes applying a GIDL voltage to the source side select lines (SGS) of selected XY sub-blocks to pass the erase voltage from the source lines to NAND channels in selected XY sub-blocks. In one embodiment, the voltage is about 11.5V less than the voltage applied to the source line. The combination of this voltage and the source line voltage will generate a GIDL current, in an embodiment. With reference to FIG. 5A the GIDL voltage may be applied to source select lines 502-2 and 502-11.

Step 1216 includes applying cutoff voltage to SGS of unselected XY sub-blocks to prevent the erase voltage from passing to NAND channels in unselected XY sub-blocks. As example of the cutoff voltage is 0V. With reference to FIG. 5A the cutoff voltage may be applied to source select lines 502-1, 502-3, 502-4, 502-5, 502-6, 502-7, 502-8, 502-9, 502-10, and 502-12. Therefore, the erase voltage on the source lines 602-1, 602-3, 602-4, 602-5, 602-6, 602-7, 602-8, 602-9, 602-10, and 602-12 will not reach the channels of the NAND strings in the unselected XY sub-blocks, whereby erase of those NAND strings is prevented.

In view of the foregoing, an embodiment includes an apparatus comprising a three-dimensional memory structure having a plurality of blocks, each block having a plurality of word lines and select lines. The select lines include a plurality of source side select lines and a plurality of drain side select lines. Each block has NAND strings extending in a z-direction through the block. Each NAND string has memory cells and select transistors. Each word line is connected to all of the NAND strings of the block. Each select line is connected to select transistors on a set of the NAND strings that comprise an XY sub-block. Each block has one or more source lines connected to a source end of the NAND strings of a block. The apparatus also comprises bit lines extending across the plurality of blocks in an x-direction. The XY sub-blocks have a plurality of groups of XY sub-blocks with a drain end of the NAND strings of each group of XY sub-blocks being connected to a different group of contiguous bit lines. The apparatus also comprises one or more control circuits in communication with the memory structure and the bit lines. The one or more control circuits are configured to perform a memory operation in multiple XY sub-blocks in parallel while inhibiting the memory operation in all other XY sub-blocks in a particular block. Each XY sub-block of the multiple XY sub-blocks has the drain end of its NAND strings connected to a different group of contiguous bit lines.

In a further embodiment the memory operation comprises a program operation and the one or more control circuits are configured to program selected memory cells in each of the multiple XY sub-blocks in parallel while inhibiting programming of all memory cells in all other XY sub-blocks in the particular block.

In a further embodiment the one or more control circuits are configured to: apply a channel inhibit voltage to the one or more source lines of the particular block; apply a cutoff voltage to the source side select lines of the multiple XY sub-blocks to electrically disconnect the one or more source lines from NAND channels in the multiple XY sub-blocks; and apply a voltage to the source side select lines of all other XY sub-blocks in the particular block to pass the channel inhibit voltage from the one or more source lines to channels of NAND strings in all the other XY sub-blocks in the particular block to prevent programming in all the other XY sub-blocks in the particular block.

In a further embodiment the one or more control circuits are configured to: apply a program voltage to a selected word line in the particular block, and apply a boosting voltage to unselected word lines in the particular block. The channel inhibit voltage is approximately half of a sum of the program voltage and the boosting voltage.

In a further embodiment the voltage applied to the source side select line of all other XY sub-blocks in the particular block has a magnitude that generates gate-induced drain leakage (GIDL) current in source side select transistors in the other XY sub-blocks in the particular block.

In a further embodiment the memory operation comprises an erase operation and the one or more control circuits are configured to erase the multiple XY sub-blocks in parallel while inhibiting erase in all other XY sub-blocks in the particular block.

In a further embodiment the one or more control circuits are configured to: apply an erase enable voltage to the word lines in the particular block; apply an erase voltage to the one or more source lines of the particular block; apply a voltage to the source side select lines of the multiple XY sub-blocks to pass the erase voltage from the one or more source lines to channels of the NAND strings in the multiple XY sub-blocks; and apply a cutoff voltage to the source side select lines of all other XY sub-blocks in the particular block to block the erase voltage from passing from the one or more source lines to channels of NAND strings in the other XY sub-blocks the particular block.

In a further embodiment the one or more source lines of each block comprise: a first source line associated with a first group of XY sub-blocks whose NAND strings are connected to a first group of contiguous bit lines; and a second source line associated with a second group of XY sub-blocks whose NAND strings are connected to a second group of contiguous bit lines.

In a further embodiment the one or more source lines of each block comprise a plurality of source lines, wherein each source line is in a different XY sub-block.

In a further embodiment the memory operation comprises a program operation and the one or more control circuits are configured to: apply a channel inhibit voltage to the source line of each XY sub-block in the particular block to be inhibited from programming; apply a voltage that is lower than the channel inhibit voltage to the source lines of the multiple XY sub-blocks; apply a voltage the source side select lines of the multiple XY sub-blocks to electrically disconnect the source lines of the multiple XY sub-blocks from channels of NAND strings of the multiple XY sub-blocks; and apply a gate-induced drain leakage (GIDL) voltage to the source side select lines of all other XY sub-blocks in the particular block to pass the channel inhibit voltage from the source lines of the other XY sub-blocks to channels of NAND strings in all the other XY sub-blocks in the particular block.

In a further embodiment the memory operation comprises an erase operation and the one or more control circuits are configured to: float the source line of each XY sub-block in the particular block to be inhibited from erase; apply an erase voltage to the source lines of the multiple XY sub-blocks; apply a voltage to the source side select lines of the multiple XY sub-blocks to pass the erase voltage from the source lines of the multiple XY sub-blocks to channels of NAND strings in the multiple XY sub-blocks; and apply a cutoff voltage to the source side select lines of all other XY sub-blocks in the particular block to electrically disconnect the source lines from the other XY sub-blocks in the particular block.

In a further embodiment the memory operation comprises an erase operation and the one or more control circuits are configured to: ground the source line of each XY sub-block in the particular block to be inhibited from programming; apply an erase voltage to the source lines of the multiple XY sub-blocks; apply a voltage to the source side select lines of the multiple XY sub-blocks to pass the erase voltage from the source lines of the multiple XY sub-blocks to channels of NAND strings in the multiple XY sub-blocks; and apply a cutoff voltage to the source side select lines of all other XY sub-blocks in the particular block to electrically disconnect the source lines from the other XY sub-blocks in the particular block.

One embodiment includes a method for programming NAND memory. The method comprises applying a first data pattern to a first set of contiguous bit lines and a second data pattern to a second set of contiguous bit lines connected to a block that comprises NAND strings. The block comprises word lines with each word line connected to each NAND string of the block. The block comprises a first group of XY sub-blocks whose NAND strings are connected to the first set of contiguous bit lines and a second group of XY sub-blocks whose NAND strings are connected to the second set of contiguous bit lines. The method comprises applying a program voltage to a selected word line in the block. The method comprises applying a boosting voltage to unselected word lines in the block. The method comprises applying a channel inhibit voltage to one or more source lines connected to XY sub-blocks to be inhibited from programming. The method comprises applying a voltage to a first source side select line connected to source side select gates on NAND strings in a first XY sub-block of the first group of XY sub-blocks and to a second source side select line connected to source side select gates on NAND strings in a second XY sub-block of the second group of XY sub-blocks that allows programming in the first XY sub-block and the second XY sub-block. The method comprises applying a voltage to source side select lines connected to source side select gates on all other NAND strings in the block to pass the channel inhibit voltage from the one or more source lines to channels of the NAND strings in all the other NAND strings in the block to inhibit programming in all other NAND strings in the block.

One embodiment includes a non-volatile storage system comprising a plurality of bit lines including a first contiguous group of bit lines and a second contiguous group of bit lines. The storage system comprises a three-dimensional memory structure having a plurality of blocks, each block having NAND strings extending in a z-direction through the block. Each block has a plurality of word lines. Each word line is connected to all of the NAND strings in the block. Each block has one or more source lines. Each NAND string has memory cells, a drain side select gate connected to a bit line of the plurality of bit lines, and a source side select gate. Each source side select gate has a control terminal, a first terminal connected to a channel of a NAND string, and a second terminal connected to a source line of the one or more source lines. The storage system further comprises one or more control circuits in communication with the memory structure and the bit lines. The one or more control circuits are configured to apply voltages to the word lines in a selected block, the first contiguous group of bit lines, and the second contiguous group of bit lines to perform a memory operation within the selected block. The one or more control circuits are configured to apply voltages to the control terminals and the second terminals of the source side select gates of a first contiguous group of NAND strings in the selected block connected to the first contiguous group of bit lines and to a second contiguous group of NAND strings in the selected block connected to the second contiguous group of bit lines to allow the memory operation in the first contiguous group of NAND strings and the second contiguous group of NAND strings while applying voltages to the control terminals and the second terminals of the source side select gates of all other NAND strings in the selected block connected to the first or second contiguous group of bit lines to prevent the memory operation in all other NAND strings in the selected block connected to the first or second contiguous group of bit lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a three-dimensional memory structure having a plurality of blocks, each block having a plurality of word lines and select lines, the select lines including a plurality of source side select lines and a plurality of drain side select lines, each block having NAND strings extending in a z-direction through the block, each NAND string having memory cells and select transistors, each word line connected to all of the NAND strings of the block, each select line connected to select transistors on a set of the NAND strings that comprise an XY sub-block, each block having one or more source lines connected to a source end of the NAND strings of a block;
bit lines extending across the plurality of blocks in an x-direction, wherein the XY sub-blocks have a plurality of groups of XY sub-blocks with a drain end of the NAND strings of each group of XY sub-blocks being connected to a different group of contiguous bit lines; and
one or more control circuits in communication with the memory structure and the bit lines, wherein the one or more control circuits are configured to:
perform a program operation in multiple XY sub-blocks in a particular block in parallel while inhibiting the program operation in all other XY sub-blocks in the particular block, including program selected memory cells in each of the multiple XY sub-blocks in parallel while inhibiting programming of all memory cells in all other XY sub-blocks in the particular block, wherein each XY sub-block of the multiple XY sub-blocks has the drain end of its NAND strings connected to a different group of contiguous bit lines.

2. The apparatus of claim 1, wherein the one or more control circuits are configured to:
apply a channel inhibit voltage to the one or more source lines of the particular block;
apply a cutoff voltage to the source side select lines of the multiple XY sub-blocks to electrically disconnect the one or more source lines from NAND channels in the multiple XY sub-blocks; and
apply a voltage to the source side select lines of all other XY sub-blocks in the particular block to pass the channel inhibit voltage from the one or more source lines to channels of NAND strings in all the other XY sub-blocks in the particular block to prevent programming in all the other XY sub-blocks in the particular block.

3. The apparatus of claim 2, wherein:
the one or more control circuits are configured to:
apply a program voltage to a selected word line in the particular block; and
apply a boosting voltage to unselected word lines in the particular block; and
the channel inhibit voltage is approximately half of a sum of the program voltage and the boosting voltage.

4. The apparatus of claim 3, wherein:
the voltage applied to the source side select line of all other XY sub-blocks in the particular block has a magnitude that generates gate-induced drain leakage (GIDL) current in source side select transistors in the other XY sub-blocks in the particular block.

5. The apparatus of claim 1, wherein the one or more source lines of each block comprise:
a first source line associated with a first group of XY sub-blocks whose NAND strings are connected to a first group of contiguous bit lines; and
a second source line associated with a second group of XY sub-blocks whose NAND strings are connected to a second group of contiguous bit lines.

6. The apparatus of claim 1, wherein the one or more source lines of each block comprise:
a plurality of source lines, wherein each source line is in a different XY sub-block.

7. The apparatus of claim 6, wherein the one or more control circuits are configured to:
apply a channel inhibit voltage to the source line of each XY sub-block in the particular block to be inhibited from programming;
apply a voltage that is lower than the channel inhibit voltage to the source lines of the multiple XY sub-blocks;
apply a voltage to the source side select lines of the multiple XY sub-blocks to electrically disconnect the source lines of the multiple XY sub-blocks from channels of NAND strings of the multiple XY sub-blocks; and
apply a gate-induced drain leakage (GIDL) voltage to the source side select lines of all other XY sub-blocks in the particular block to pass the channel inhibit voltage from the source lines of the other XY sub-blocks to channels of NAND strings in all the other XY sub-blocks in the particular block.

8. A method for programming NAND memory, the method comprising:
applying a first data pattern to a first set of contiguous bit lines and a second data pattern to a second set of contiguous bit lines connected to a block that comprises NAND strings, wherein the block comprises word lines with each word line connected to each NAND string of the block, wherein the block comprises a first group of XY sub-blocks whose NAND strings are connected to the first set of contiguous bit lines and a second group of XY sub-blocks whose NAND strings are connected to the second set of contiguous bit lines;
applying a program voltage to a selected word line in the block;
applying a boosting voltage to unselected word lines in the block;
applying a channel inhibit voltage to one or more source lines connected to XY sub-blocks to be inhibited from programming;
applying a voltage to a first source side select line connected to source side select gates on NAND strings in a first XY sub-block of the first group of XY sub-blocks and to a second source side select line connected to source side select gates on NAND strings in a second XY sub-block of the second group of XY sub-blocks that allows programming in the first XY sub-block and the second XY sub-block; and
applying a voltage to source side select lines connected to source side select gates on all other NAND strings in the block to pass the channel inhibit voltage from the one or more source lines to channels of the NAND strings in all the other NAND strings in the block to inhibit programming in all other NAND strings in the block.

9. The method of claim 8, further comprising:
applying the channel inhibit voltage to one or more source lines connected to the first XY sub-block and the second XY sub-block, wherein applying the voltage to the first source side select line and to the second source side select line prevents the channel inhibit voltage from passing from the one or more source lines to the channels of the NAND strings in the first XY sub-block and the second XY sub-block.

10. The method of claim 8, further comprising:
applying a voltage that is less than the channel inhibit voltage to a first source line of the first XY sub-block and a second source line of the second XY sub-block, wherein applying the voltage to the first source side select line and to the second source side select line prevents the voltage that is less than the channel inhibit voltage from passing from the first source line to the channels of the NAND strings in the first XY sub-block and from the second source line to channels of the NAND strings in the second XY sub-block.

11. A non-volatile storage system, comprising:
a plurality of bit lines including a first contiguous group of bit lines and a second contiguous group of bit lines;
a three-dimensional memory structure having a plurality of blocks, each block having NAND strings extending in a z-direction through the block, each block having a plurality of word lines, each word line connected to all of the NAND strings in the block, each block having one or more source lines, each NAND string having:
memory cells, a drain side select gate connected to a bit line of the plurality of bit lines, and a source side select gate, wherein each source side select gate has a control terminal, a first terminal connected to a channel of a NAND string, and a second terminal connected to a source line of the one or more source lines, each block comprises a plurality of source side select lines including:
a first set of source side select lines, each source side select line in the first set connected to the control terminals of source side select gates of a contiguous group of NAND strings of a first set of contiguous groups of NAND strings connected to the first contiguous group of bit lines; and
a second set of source side select lines, each source side select line in the second set connected to the control terminals of source side select gates of a contiguous group of NAND strings of a second set of contiguous groups of NAND strings connected to the second contiguous group of bit lines; and
one or more control circuits in communication with the memory structure and the bit lines, wherein the one or more control circuits are configured to:
apply voltages to the word lines in a selected block, the first contiguous group of bit lines, and the second contiguous group of bit lines to perform a memory operation within the selected block;
apply a channel inhibit voltage to the one or more source lines of the selected block; and
apply voltages to the control terminals and the second terminals of the source side select gates of a first contiguous group of NAND strings in the selected block connected to the first contiguous group of bit lines and to a second contiguous group of NAND strings in the selected block connected to the second contiguous group of bit lines to allow the memory operation in the first contiguous group of NAND strings and the second contiguous group of NAND strings while applying voltages to the control terminals and the second terminals of the source side select gates of all other NAND strings in the selected block connected to the first or second contiguous group of bit lines to prevent the memory operation in all other NAND strings in the selected block connected to the first or second contiguous group of bit lines, including:
apply a voltage to a first source side select line of the first set of source side select lines, the first source side select line connected to the source side select gates of the first contiguous group of NAND strings to cut off the one or more source lines from the channels of the first contiguous group of NAND strings;
apply a voltage to a second source side select line of the second set of source side select lines, the second source side select line connected to the source side select gates of the second contiguous group of NAND strings to cut off the one or more source lines from the channels of the second contiguous group of NAND strings; and
apply a voltage to the source side select lines connected to all other NAND strings in the selected block to pass the channel inhibit voltage from the one or more source lines to all other NAND strings in the selected block.

12. The non-volatile storage system of claim 11, wherein:
each block comprises a plurality of source lines, including:
a first set of source lines, each source line in the first set of source lines connected to the second terminals of source side select transistors of a contiguous group of NAND strings of a first set contiguous groups of NAND strings connected to the first contiguous group of bit lines; and
a second set of source lines, each source line in the second set connected to the second terminals of source side select transistors of a contiguous group of NAND strings of a second set contiguous groups of NAND strings connected to the second contiguous group of bit lines.

13. The non-volatile storage system of claim 12, wherein the one or more control circuits are configured to:
apply a channel inhibit voltage to the source line of each contiguous group of NAND strings to be inhibited from programming;
apply a voltage that is lower than the channel inhibit voltage to a first source line connected to the first contiguous group of NAND strings and to a second source line connected to the second contiguous group of NAND strings;
apply a voltage to the source side select line connected to the source side select transistors of the first contiguous group of NAND strings to cut off the first source line from the channels of the first contiguous group of NAND strings;
apply a voltage to the source side select line connected to the source side select transistors of the second contiguous group of NAND strings to cut off the second source line from the channels of the second contiguous group of NAND strings; and
apply a gate-induced drain leakage (GIDL) voltage to the source side select line connected to all other contiguous groups of NAND strings in the selected block to pass the channel inhibit voltage from the one or more source lines to all other contiguous groups of NAND strings in the selected block.

14. An apparatus comprising:
a three-dimensional memory structure having a plurality of blocks, each block having a plurality of word lines and select lines, the select lines including a plurality of source side select lines and a plurality of drain side select lines, each block having NAND strings extending in a z-direction through the block, each NAND string having memory cells and select transistors, each word line connected to all of the NAND strings of the block, each select line connected to select transistors on a set of the NAND strings that comprise an XY sub-block, each block having one or more source lines connected to a source end of the NAND strings of a block;
bit lines extending across the plurality of blocks in an x-direction, wherein the XY sub-blocks have a plurality of groups of XY sub-blocks with a drain end of the NAND strings of each group of XY sub-blocks being connected to a different group of contiguous bit lines; and
one or more control circuits in communication with the memory structure and the bit lines, wherein the one or more control circuits are configured to:
perform an erase operation in multiple XY sub-blocks in a particular block in parallel while inhibiting the erase operation in all other XY sub-blocks in the particular block, including erase the multiple XY sub-blocks in parallel while inhibiting erase in all other XY sub-blocks in the particular block, wherein each XY sub-block of the multiple XY sub-blocks has the drain end of its NAND strings connected to a different group of contiguous bit lines.

15. The apparatus of claim 14, wherein the one or more source lines of each block comprise:
a plurality of source lines, wherein each source line is in a different XY sub-block.

16. The apparatus of claim 15, wherein the one or more control circuits are configured to:
float the source line of each XY sub-block in the particular block to be inhibited from erase;
apply an erase voltage to the source lines of the multiple XY sub-blocks;
apply a voltage to the source side select lines of the multiple XY sub-blocks to pass the erase voltage from the source lines of the multiple XY sub-blocks to channels of NAND strings in the multiple XY sub-blocks; and
apply a cutoff voltage to the source side select lines of all other XY sub-blocks in the particular block to electrically disconnect the source lines from the other XY sub-blocks in the particular block.

17. The apparatus of claim 15, wherein the one or more control circuits are configured to:
ground the source line of each XY sub-block in the particular block to be inhibited from programming;
apply an erase voltage to the source lines of the multiple XY sub-blocks;
apply a voltage to the source side select lines of the multiple XY sub-blocks to pass the erase voltage from the source lines of the multiple XY sub-blocks to channels of NAND strings in the multiple XY sub-blocks; and
apply a cutoff voltage to the source side select lines of all other XY sub-blocks in the particular block to electrically disconnect the source lines from the other XY sub-blocks in the particular block.

* * * * *